(12) United States Patent
Chuang

(10) Patent No.: US 12,463,090 B2
(45) Date of Patent: Nov. 4, 2025

(54) METHOD OF MANUFACTURING SEMICONDUCTOR STRUCTURE INCLUDING A PLANARIZATION AND SEMICONDUCTOR STRUCTURE THEREOF

(71) Applicant: NANYA TECHNOLOGY CORPORATION, New Taipei (TW)

(72) Inventor: Ying-Cheng Chuang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 421 days.

(21) Appl. No.: 18/133,058

(22) Filed: Apr. 11, 2023

(65) Prior Publication Data
US 2024/0347378 A1    Oct. 17, 2024

(51) Int. Cl.
*H01L 21/768*    (2006.01)
*H01L 23/528*    (2006.01)

(52) U.S. Cl.
CPC .. *H01L 21/76802* (2013.01); *H01L 21/76837* (2013.01); *H01L 23/5283* (2013.01)

(58) Field of Classification Search
CPC ......... H01L 21/76802; H01L 21/76837; H01L 21/76877; H01L 21/31053; H01L 21/31056; H01L 21/76819; H01L 21/31051; H01L 21/304
See application file for complete search history.

(56) References Cited

U.S. PATENT DOCUMENTS

| | | | |
|---|---|---|---|
| 2014/0209990 A1* | 7/2014 | Lu ........................ | H10D 30/681 257/773 |
| 2019/0067103 A1* | 2/2019 | Zhang ............... | H01L 21/76843 |
| 2019/0074219 A1* | 3/2019 | Zhang ............... | H01L 21/76837 |
| 2019/0348322 A1* | 11/2019 | Mullick ............ | H01L 21/76807 |
| 2020/0035601 A1* | 1/2020 | Ha ..................... | H01L 21/76837 |
| 2020/0098688 A1* | 3/2020 | Shi ................... | H01L 21/28568 |

(Continued)

FOREIGN PATENT DOCUMENTS

| | | |
|---|---|---|
| CN | 106057873 A | 10/2016 |
| CN | 115249738 A | 10/2022 |

(Continued)

OTHER PUBLICATIONS

Office Action mailed on Jan. 23, 2024 related to Taiwanese Application No. 112123898.

(Continued)

*Primary Examiner* — Bac H Au
(74) *Attorney, Agent, or Firm* — Xuan Zhang

(57) ABSTRACT

The present application provides a semiconductor structure and a manufacturing method of the semiconductor structure. A substrate is provided, wherein the substrate includes a plurality of pillars, and a top surface of each of the plurality of pillars is a substantially planar surface. A first oxide layer is formed over the substrate conformal to the pillars, wherein the formation of the first oxide layer includes oxidizing top corners of the pillars, thereby causing the top surface of each of the plurality of pillars to become a convex surface. A first dielectric layer is formed among the pillars, wherein the first oxide layer above the plurality of pillars is partially exposed through the first dielectric layer. A planarization is performed on the pillars to partially or entirely remove the convex surface.

15 Claims, 21 Drawing Sheets

(56) References Cited

U.S. PATENT DOCUMENTS

| | | | | |
|---|---|---|---|---|
| 2020/0168503 A1* | 5/2020 | Roy | ................. | H01L 21/31111 |
| 2020/0194304 A1* | 6/2020 | Roy | ................. | H01L 21/76877 |
| 2020/0273714 A1* | 8/2020 | Lai | ....................... | H01L 21/311 |
| 2024/0347379 A1* | 10/2024 | Chuang | ............. | H01L 21/76837 |
| 2024/0347448 A1* | 10/2024 | Chuang | ............ | H01L 21/76819 |
| 2024/0347449 A1* | 10/2024 | Chuang | ................ | H01L 23/528 |

FOREIGN PATENT DOCUMENTS

| | | |
|---|---|---|
| TW | 202222687 A | 6/2022 |
| TW | 202301551 A | 1/2023 |

OTHER PUBLICATIONS

Office Action and and the search report mailed on Jan. 10, 2025 related to Taiwanese Application No. 113107998.

Summary translation of Office Action and and the search report mailed on Jan. 10, 2025 related to Taiwanese Application No. 113107998.

\* cited by examiner

METHOD OF MANUFACTURING SEMICONDUCTOR STRUCTURE INCLUDING A PLANARIZATION AND SEMICONDUCTOR STRUCTURE THEREOF

TECHNICAL FIELD

The present disclosure relates to a method of manufacturing a semiconductor structure, and a semiconductor structure formed by the method. In particular, the present disclosure relates to a method including a planarization to prevent rounding from occurring due to formation of an oxide material.

DISCUSSION OF THE BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of precise control of configuration of an element have arisen.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing a semiconductor structure. The method includes a number of operations. A substrate is provided, wherein the substrate includes a plurality of pillars, and a top surface of each of the plurality of pillars is a substantially planar surface. A first oxide layer is formed over the substrate conformal to the plurality of pillars, wherein the formation of the first oxide layer includes oxidizing top corners of the plurality of pillars, thereby causing the top surface of each of the plurality of pillars to become a convex surface. A first dielectric layer is formed among the plurality of pillars, wherein the first oxide layer above the plurality of pillars is partially exposed through the first dielectric layer. A planarization is performed on the plurality of pillars to partially or entirely remove the convex surface. A second dielectric layer is formed over the plurality of pillars, the first oxide layer and the first dielectric layer, wherein a top surface of the second dielectric layer is a substantially planar surface.

Another aspect of the present disclosure provides a method for manufacturing a semiconductor structure. The method includes a number of operations. A substrate is provided, wherein the substrate includes a plurality of pillars, and a top surface of each of the plurality of pillars is a substantially planar surface. A first oxide layer is formed over the substrate conformal to the plurality of pillars, wherein each of the plurality of pillars is partially oxidized during the formation of the first oxide layer to form a rounded top surface of each of the plurality of pillars. A first dielectric layer is formed over the substrate and among the pillars. Each of the plurality of pillars is partially removed until the rounded top surface becomes a planar top surface of the respective pillar. A second dielectric layer is formed over the plurality of pillars, wherein a top surface of the second dielectric layer is a substantially planar surface.

Another aspect of the present disclosure provides a semiconductor structure. The semiconductor structure includes a substrate, a first dielectric layer, a plurality of first contacts, and a plurality of second contacts. The substrate includes a plurality of pillars in an array region of the substrate, wherein a top surface of each of the plurality of pillars is a substantially planar surface. The first dielectric layer surrounds each of the plurality of pillars, wherein a top surface of the first dielectric layer is substantially coplanar with the top surface of each of the plurality of pillars. The plurality of first contacts is disposed in the pillars. The plurality of second contacts is disposed between the pillars and surrounded by the first dielectric layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
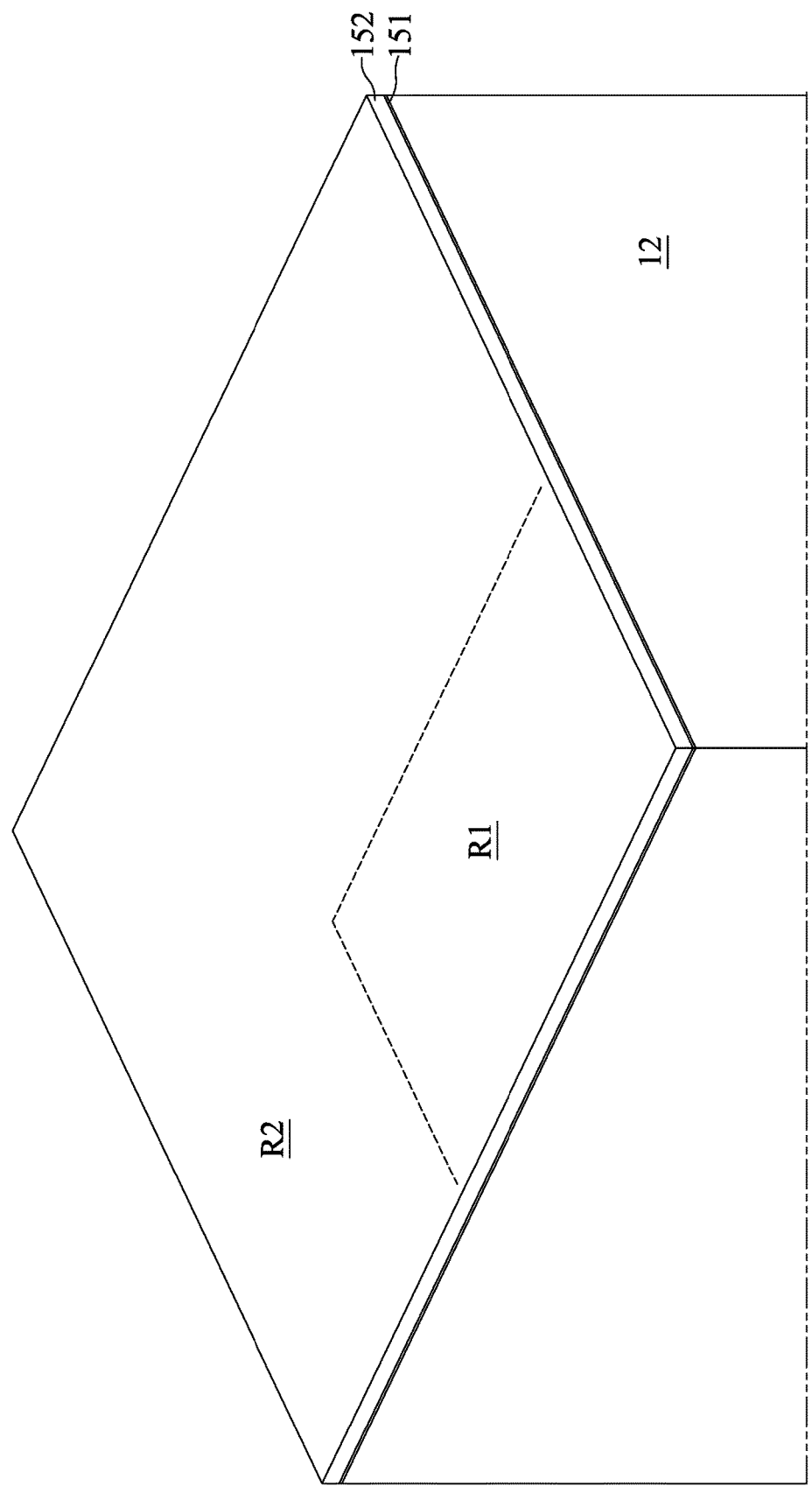
FIG. 1 is a schematic 3D diagram of an intermediate stage in formation of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As the semiconductor industry has progressed into advanced technology process nodes in pursuit of greater device density, it is important to reach an advanced precision of control of a configuration of elements formed in a device. For instance, a configuration of a silicon pillar of a substrate in an array region of a memory device can be affected by operations performed in subsequent processes. When undesired oxidation on the silicon pillar occurs, the configuration of the silicon pillar is changed. Rounding of edges or formation of an uneven surface of the silicon pillar results in a reduction of a contact area between the silicon pillar and a landing pad, and an electrical disconnection or high electric resistance between the silicon pillar and the landing pad occurs. The present disclosure relates to a method for manufacturing a semiconductor structure. In particular, the method of the present disclosure is able to provide a planar surface of a silicon pillar so as to avoid issues of electrical disconnection and high electric resistance. A performance of a device formed according to the method and a product yield can be thereby improved.

FIGS. 1 to 19 are schematic diagrams from different perspectives illustrating various fabrication stages according to one or more methods for manufacturing a semiconductor structure in accordance with some embodiments of the present disclosure. The stages shown in FIGS. 1 to 19 are also illustrated schematically in process flows of a method S1 in FIG. 20 or a method S2 in FIG. 21.

Referring to FIG. 1, one or more dielectric layers are formed over a substrate 12. In some embodiments prior to the formation of the dielectric layer(s), the substrate 12 is provided, received, or formed.

In some embodiments, the substrate 12 may have a multilayer structure, or the substrate 12 may include a multilayer compound semiconductor structure. In some embodiments, the substrate 12 includes semiconductor devices, electrical components, electrical elements, or a combination thereof. In some embodiments, the substrate 12 includes transistors or functional units of transistors. In some embodiments, the substrate 12 includes active components, passive components, and/or conductive elements. The active components may include a memory die (e.g., a dynamic random-access memory (DRAM) die, a static random-access memory (SRAM) die, etc.), a power management die (e.g., a power management integrated circuit (PMIC) die), a logic die (e.g., a system-on-a-chip (SoC), a central processing unit (CPU), a graphics processing unit (GPU), an application processor (AP), a microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. Each of the active components may include multiple transistors. The transistors can include planar transistors, multi-gate transistors, gate-all-around field-effect transistors (GAAFET), fin field-effect transistors (FinFET), vertical transistors, nanosheet transistors, nanowire transistors, or a combination thereof. The passive components may include a capacitor, a resistor, an inductor, a fuse or other passive components. The conductive elements may include metal lines, metal islands, conductive vias, contacts or other conductive elements.

The active components, passive components, and/or conductive elements as mentioned above can be formed in and/or over a semiconductor substrate. The semiconductor substrate may be a bulk semiconductor, a semiconductor-on-insulator (SOI) substrate, or the like. The semiconductor substrate can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

For a purpose of simplicity, the substrate 12 depicted in FIG. 1 can be only a topmost portion of a multilayer structure of the substrate 12. The substrate 12 may include an array region R1 and a peripheral region R2 surrounding the array region R1. In some embodiments, the active components or the transistors are mostly formed in the array region R1, and the peripheral region R2 is for circuit routing and may include passive components. In some embodiments, the substrate 12 includes a silicon material.

Memory cells or devices (not shown) may be formed in the array region R1 of the substrate 12. For a purpose of illustration, the figures show a portion of the substrate 12 above the memory cells or memory devices. Bit line (BL) metals and word line (WL) metals (not shown) are formed during subsequent processing over and in the topmost portion of the substrate 12 shown in FIG. 1.

A dielectric layer 151 and a dielectric layer 152 can be formed over the substrate 12. In some embodiments, the dielectric layer 151 and the dielectric layer 152 include different dielectric materials. In some embodiments, the dielectric materials include silicon oxide ($SiO_x$), silicon nitride ($Si_xN_y$), silicon oxynitride (SiON), or a combination thereof. In some embodiments, the dielectric materials include a high-k dielectric material. The high-k dielectric material may have a dielectric constant (k value) greater than 4. The high-k dielectric material may include zirconium dioxide ($ZrO_2$), hafnium oxide ($HfO_2$), aluminum oxide ($Al_2O_3$), yttrium oxide ($Y_2O_3$), lanthanum oxide ($La_2O_3$), silicates of one or more of $ZrO_2$, $HfO_2$, $Al_2O_3$, $Y_2O_3$ and $La_2O_3$, aluminates of one or more of $ZrO_2$, $HfO_2$, $Y_2O_3$ and $La_2O_3$, tantalum oxide ($Ta_2O_5$), barium titanate ($BaTiO_3$), titanium dioxide ($TiO_2$), cerium oxide ($CeO_2$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), PST ($PbSc_xTa_{1-x}O_3$), hafnium zirconium oxide ($Hf_xZr_yO_z$), hafnium zirconium aluminum oxide ($Hf_wZr_xAl_yO_z$), lithium oxide ($Li_2O$), hafnium silicon oxide ($HfSiO_4$), strontium oxide (SrO), scandium oxide ($Sc_2O_3$), molybdenum trioxide ($MoO_3$), barium oxide (BaO), or a combination thereof. Other suitable materials are within the contemplated scope of this disclosure.

In some embodiments, the dielectric layers 151 and 152 include different oxide materials listed above. In some embodiments, the dielectric layers 151 and 152 are formed by different depositions. In some embodiments, a thickness of the dielectric layer 151 is less than that of the dielectric layer 152. The dielectric layers 151 and 152 may function to protect the substrate 12 from a patterning operation subsequently performed. The two dielectric layers 151 and 152 are shown for a purpose of illustration. In alternative embodiments, only one dielectric layer is formed over the substrate 12. In other alternative embodiments, more than two dielectric layers are formed over the substrate 12.

Figure 2:
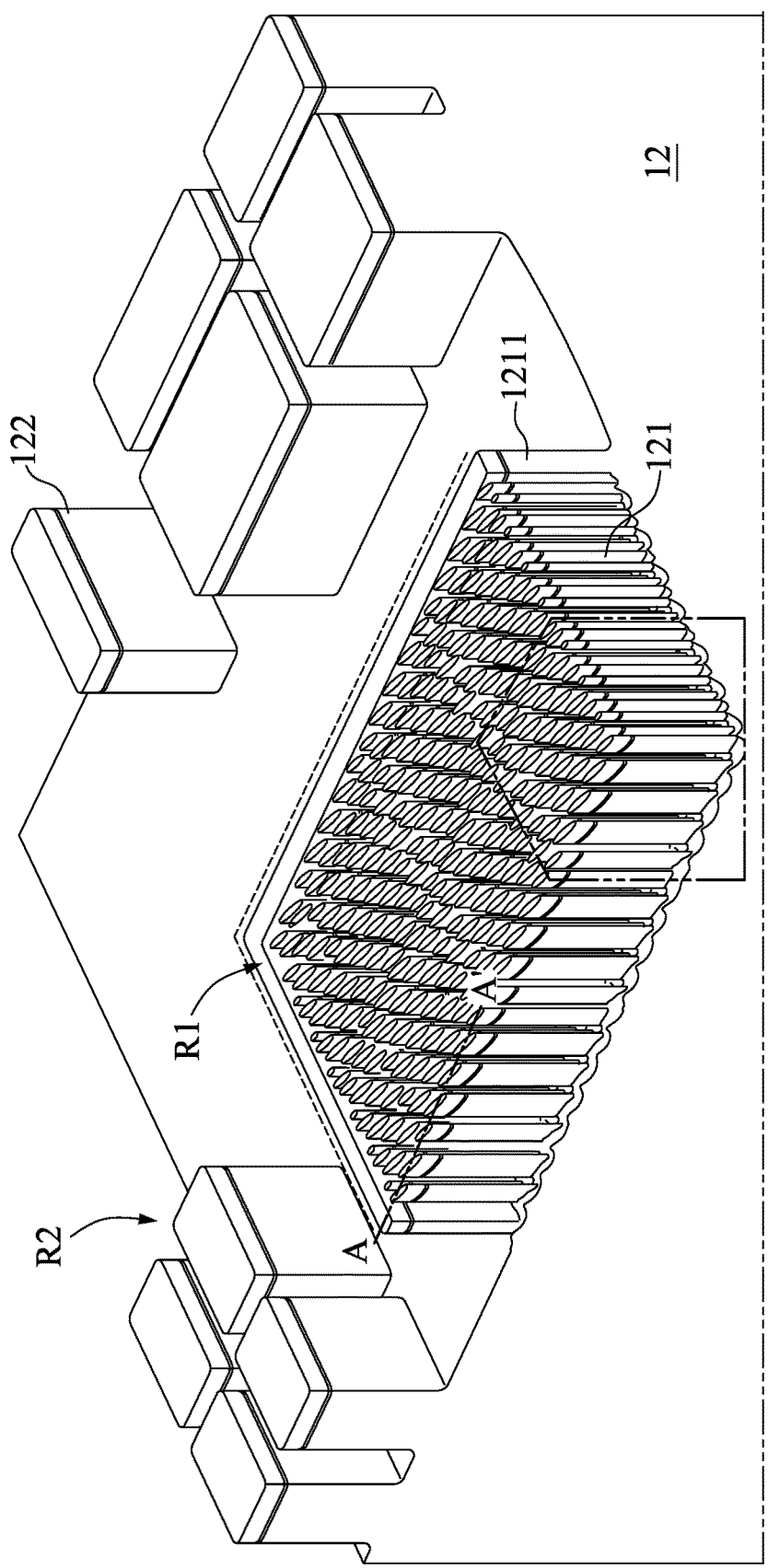
FIG. 2 is a schematic 3D diagram of an intermediate stage in formation of a semiconductor structure in accordance with some embodiments of the present disclosure.
Figure 3:
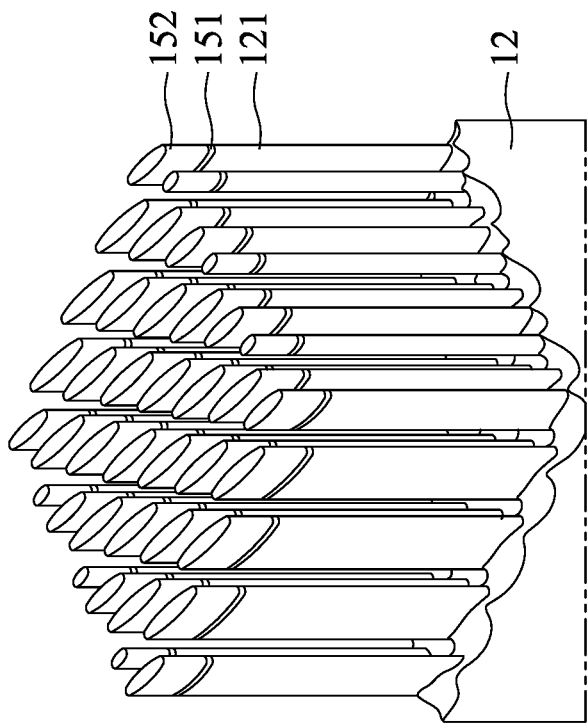
FIG. 3 is an enlarged diagram of a portion of the intermediate stage in the formation of the semiconductor structure shown in FIG. 2 in accordance with some embodiments of the present disclosure.
Figure 3:
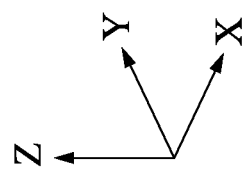
Figure 4:
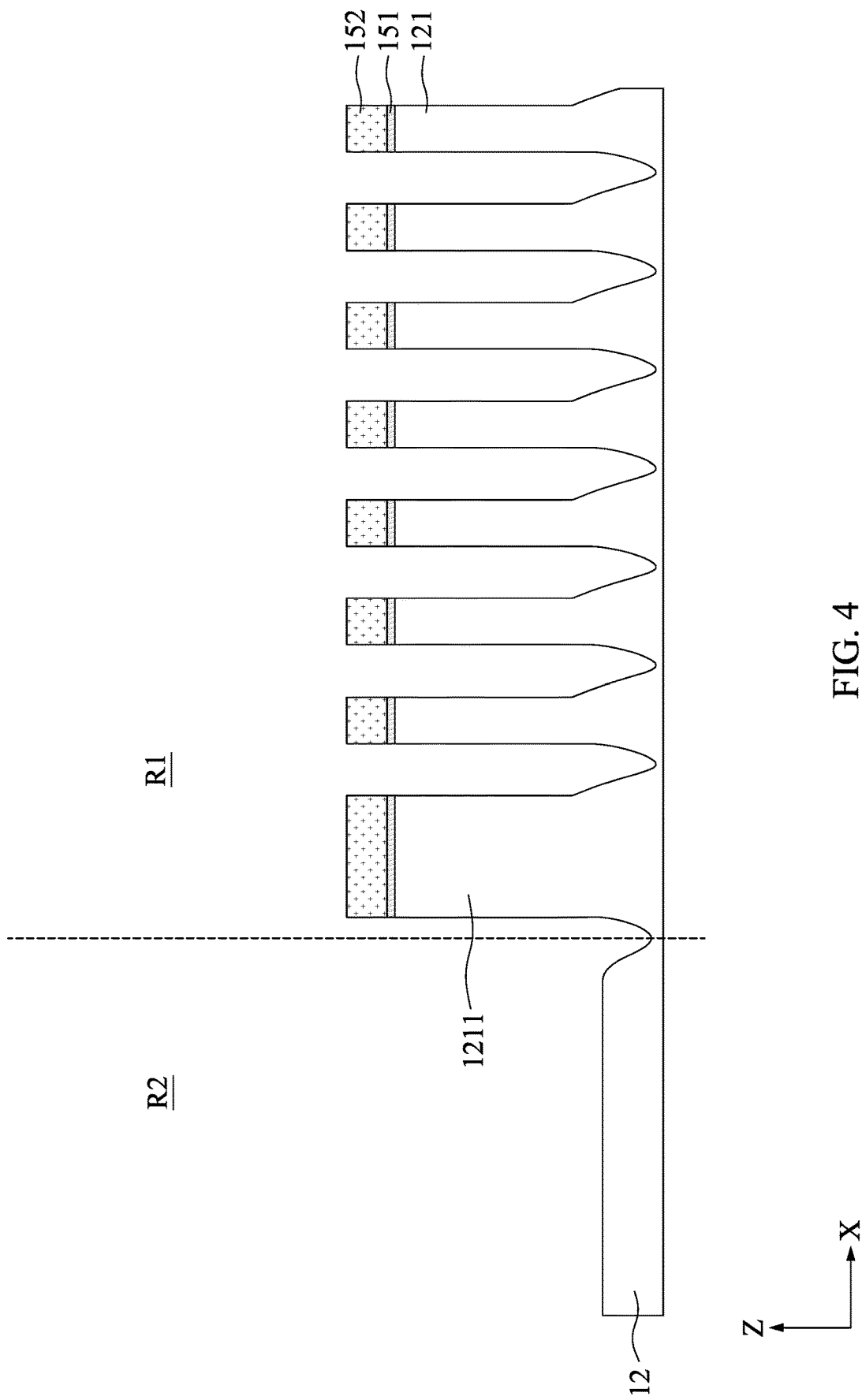
FIGS. 4 to 19 are cross-sectional diagrams along a line A-A' shown in FIG. 2 of intermediate stages in the formation of the semiconductor structure in accordance with some embodiments of the present disclosure.

Referring to FIGS. 2, 3 and 4, FIG. 2 is a schematic 3D diagram, FIG. 3 is an enlarged view of a portion of the array region R1 indicated by a dotted line in FIG. 2, and FIG. 4 is a schematic cross-sectional diagram along a line A-A' in FIG. 2 at a stage of one or more methods for manufacturing a semiconductor structure in accordance with some embodiments of the present disclosure. A patterning operation may be performed on the dielectric layers 151 and 152 and the substrate 12. In some embodiments, multiple pillar-like silicon portions 121 are formed in the array region R1. In some embodiments, multiple island-like silicon portions 122 are formed in the peripheral region R2. In some embodiments, each of the dielectric layers 151 and 152 is patterned into portions. In some embodiments, each pillar-like silicon portion 121 has a portion of the dielectric layer 151 and a portion of the dielectric layer 152 disposed thereon. In some embodiments, each island-like silicon portion 122 has a portion of the dielectric layer 151 and a portion of the dielectric layer 152 disposed thereon.

It should be noted that a silicon portion 1211 of the plurality of silicon portions 121 has a configuration different from other silicon portions 121 as shown in FIGS. 2 and 4. The silicon portion 1211 may extend along a periphery of the array region R1. The silicon portion 1211 can be a dummy structure in a memory device formed in subsequent processing. In some embodiments, the silicon portion 1211 is not considered a part of an array of memory cells of the memory device. In some embodiments, the silicon portion 1211 is for a purpose of definition of an area of the array of memory cells of the memory device.

The patterning operation performed on the dielectric layers 151 and 152 and the substrate 12 may include one or more etching operations. In some embodiments, the dielectric layers 151 and 152 and the substrate 12 are patterned sequentially by different etching operations. In some embodiments, one or more etching operations having a high selectivity to the dielectric materials of the dielectric layer 151 and/or the dielectric layer 152 and a low selectivity to a silicon material of the substrate 12 are performed. The dielectric layers 151 and 152 can be patterned by one or more etching operations depending on the dielectric materials of the dielectric layers 151 and 152. A conventional patterning method can be applied, and is not limited herein. In some embodiments, an etching operation having a low selectivity to the silicon material of the substrate 12 is performed next. In some embodiments, the dielectric layers 151 and 152 and the substrate 12 are patterned concurrently by one etching operation. In some embodiments, a non-selective etching operation is performed, and the dielectric layers 151 and 152 and the substrate 12 are patterned concurrently by one etching operation.

FIGS. 5 to 19 are schematic cross-sectional diagrams along the line A-A' in FIG. 2 at a stage of the method S1 or the method S2 in accordance with some embodiments of the present disclosure. For a purpose of illustration, the schematic cross-sectional diagrams shown in FIGS. 5 to 19 are focused on the array region R1. However, such illustration is not intended to limit the present disclosure. Similar or same operations can be performed concurrently in the peripheral region R2. In some embodiments, all operations or processes described below are performed concurrently in the array region R1 and the peripheral region R2. In some embodiments, all operations or processes described below are performed on an entirety of the substrate 12.

Figure 5:
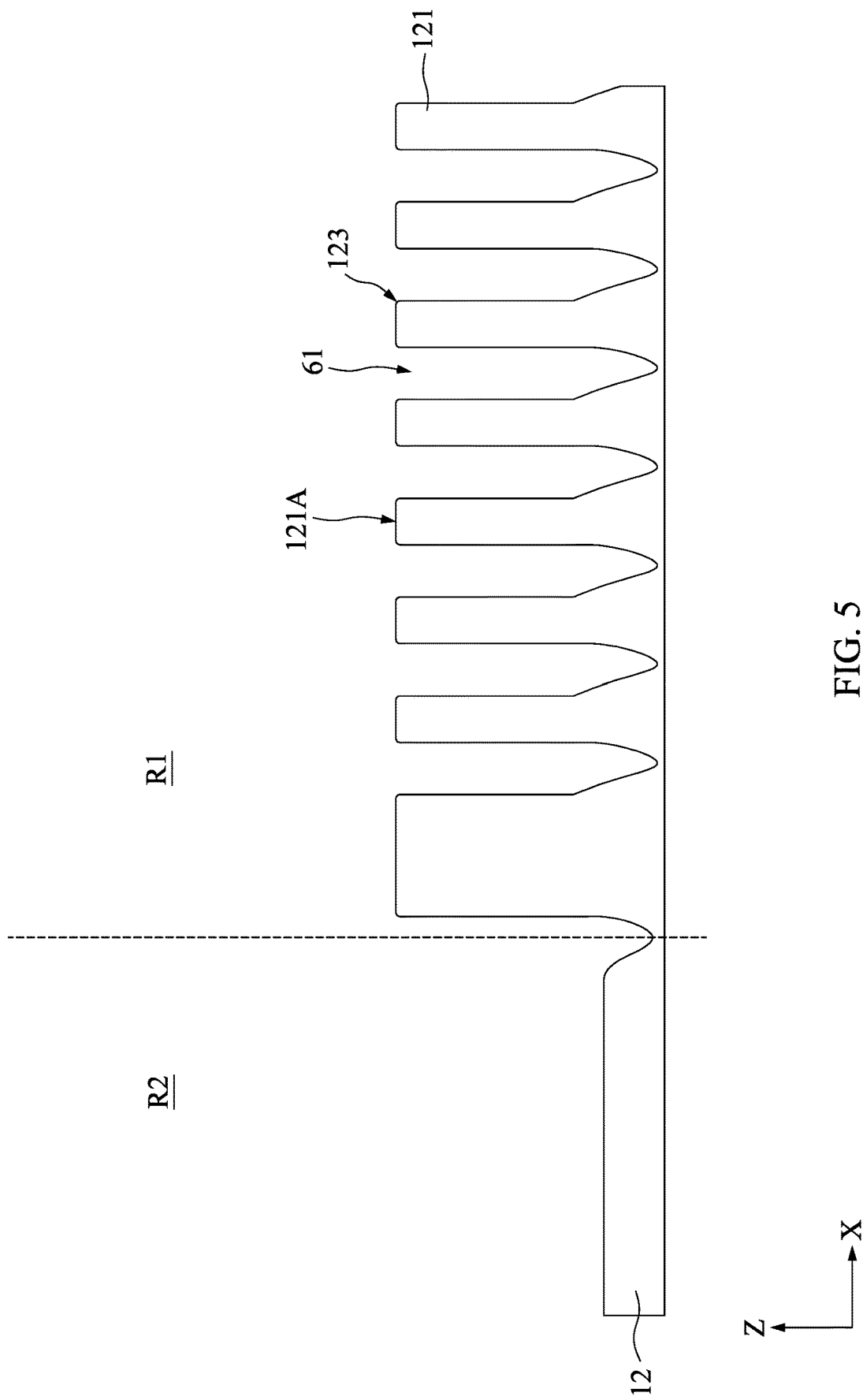

Referring to FIG. 5, the dielectric layers 151 and 152 are removed after the formation of the pillar-like silicon portions 121 and the island-like silicon portions 122. Similar to the process described above, one or more etching operations may be performed depending on the materials of the dielectric layers 151 and 152. The one or more etching operations for removing the dielectric layers 151 and 152 should have a low selectivity to the silicon material of the substrate 12. In some embodiments, a top surface 121A of each of the pillar-like silicon portions 121 is a substantially planar surface at this stage as shown in FIG. 5. A plurality of spaces 61 are defined among the pillar-like silicon portions 121 in the array region R1.

Figure 6:
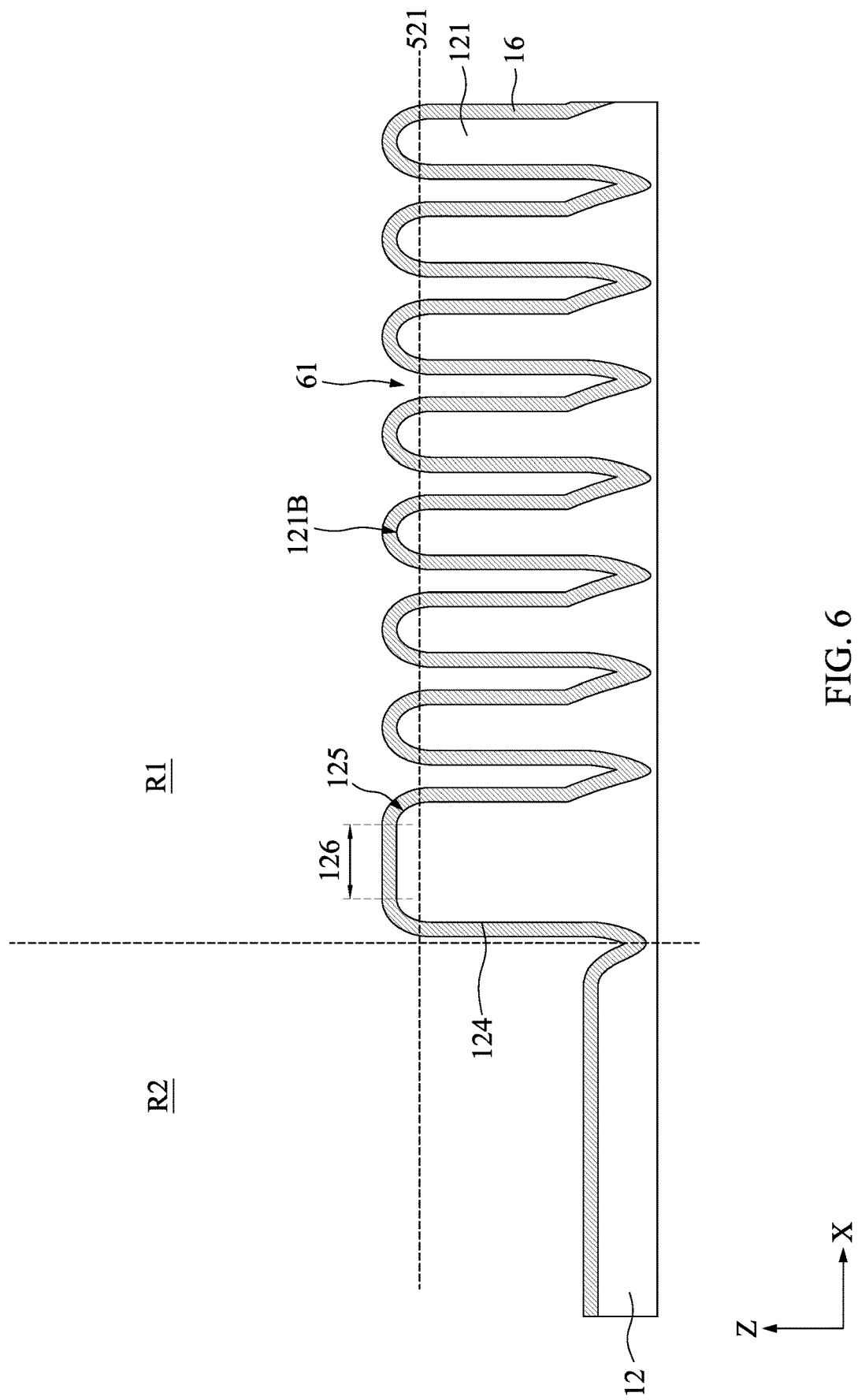

Referring to FIG. 6, an oxide layer 16 is formed over and conformal to the substrate 12. In some embodiments, a configuration of the oxide layer 16 is conformal to a configuration of the silicon portions 121 and 122 of the substrate 12. In some embodiments, the oxide layer 16 is formed by an oxidation. In some embodiments, the oxide layer 16 is formed by a deposition. In some embodiments, the oxide layer 16 is conformal to the pillar-like silicon portions 121 without filling the spaces 61 between the pillar-like silicon portions 121.

The silicon portions 121 and 122 may be oxidized during the formation of the oxide layer 16, thereby causing the top surfaces of the silicon portions 121 and top surfaces of the silicon portions 122 to become convex or rounded. As shown in FIG. 6, the top surface 121B of each of the silicon potions 121 is a convex surface or a rounded surface after the formation of the oxide layer 16. In some embodiments, top corners 123 (shown in FIG. 5) are oxidized during the formation of the oxide layer 16. In some embodiments, an entirety of the top surface 121B is rounded. In some embodiments, the top surface 121B includes rounded corners 125 and a planar portion 126 connecting the rounded corners 125. It should be noted that only the silicon portions 121 in the array region R1 are depicted in FIG. 6 for a purpose of illustration. It should be understood that the silicon portions 122 in the peripheral region R2 may have a configuration similar to those of the silicon portions 121 shown in FIG. 6. In some embodiments, each of the silicon portions 121 has a sidewall 124 connecting to and disposed below the convex top surface 121B. In some embodiments, the sidewall 124 is substantially planar, and a line 521 indicates a level of connecting points of the convex top surfaces 121B and the planar sidewalls 124 of the silicon portions 121. In some embodiments, the line 521 is at a bottom of the convex top surface 121B of the silicon portions 121.

In some embodiments, the oxide layer 16 is conformal to the convex surface 121B of the silicon portions 121. In some embodiments, the oxide layer 16 includes a substantially planar surface below the line 521. In some embodiments, a thickness of the oxide layer 16 is substantially consistent across the substrate 12. In some embodiments, the oxide layer 16 covers an entirety of the substrate 12.

Figure 7:
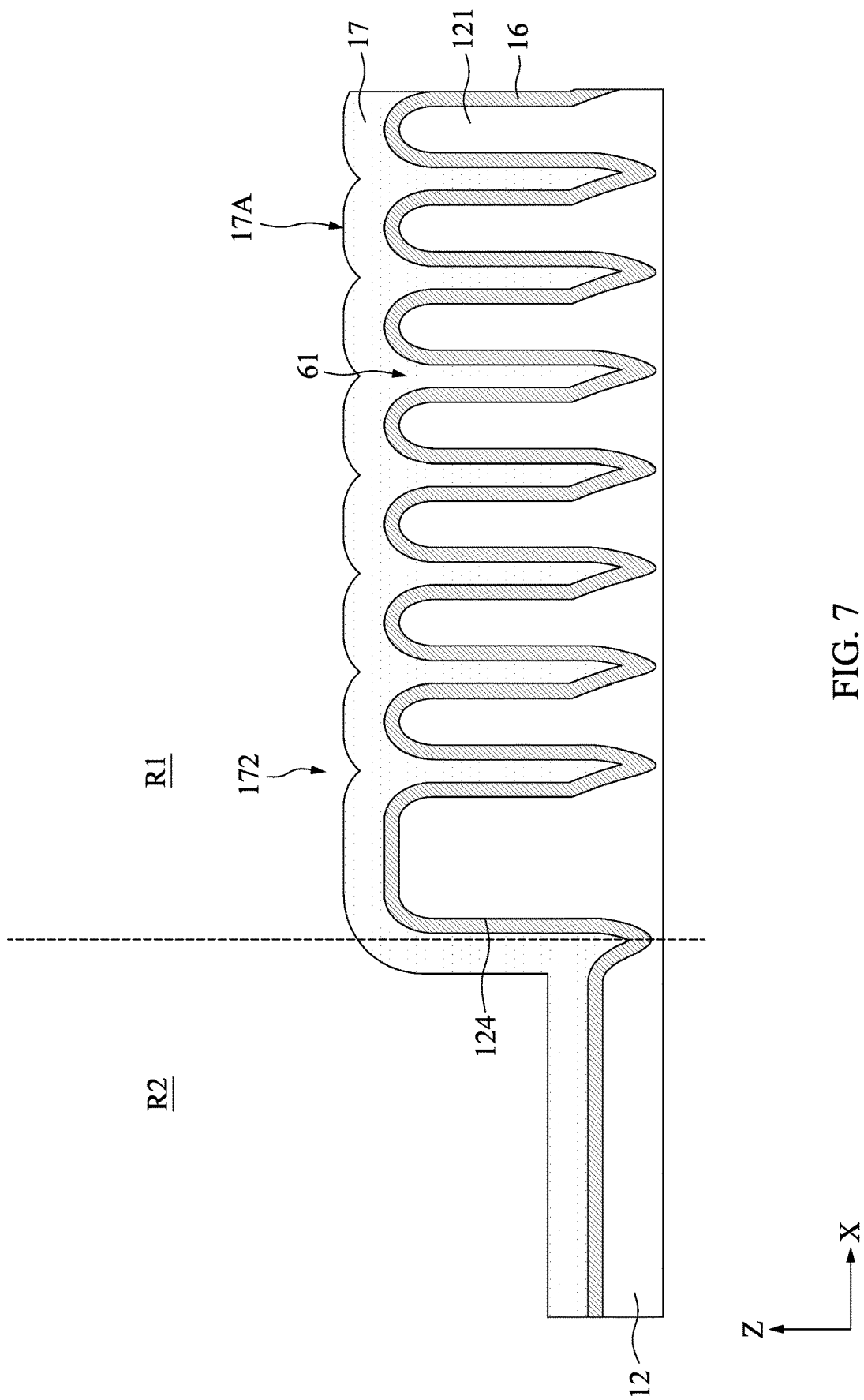

Referring to FIG. 7, a dielectric layer 17 is formed over and conformal to the substrate 12 and the silicon portions 121. In some embodiments, the dielectric layer 17 has a thickness substantially greater than a thickness of the oxide layer 16. The dielectric layer 17 can comprise one or more dielectric materials selected from the dielectric materials described in reference to the dielectric layers 151 and 152, and repeated description is omitted herein. In some embodiments, the dielectric layer 17 includes a dielectric material different from that of the oxide layer 16. In some embodiments, the dielectric layer 17 does not include oxide. In some embodiments, the dielectric layer 17 includes silicon nitride.

In some embodiments, the dielectric layer 17 is formed by a blanket deposition. In some embodiments, the formation of the dielectric layer 17 includes a chemical vapor deposition (CVD), a physical vapor deposition (PVD), or a combination thereof. In some embodiments, the dielectric layer 17 at least fills the spaces 61 among the silicon portions 121 in the array region R1. In some embodiments, the dielectric layer 17 is disposed over the oxide layer 16 and among portions of the oxide layer 16 on the sidewall 124 of the silicon portions 12. In some embodiments, a thickness of the dielectric layer 17 is substantially greater than one-half of a distance between the silicon portions 12 for a purpose of filling the spaces 61. In some embodiments, a top surface 17A of the dielectric layer 17 is not a planar surface. In some embodiments, the top surface 17A of the dielectric layer 17 includes a plurality of recesses 172 corresponding to positions of the spaces 61 due to a property of a deposition.

Figure 8:
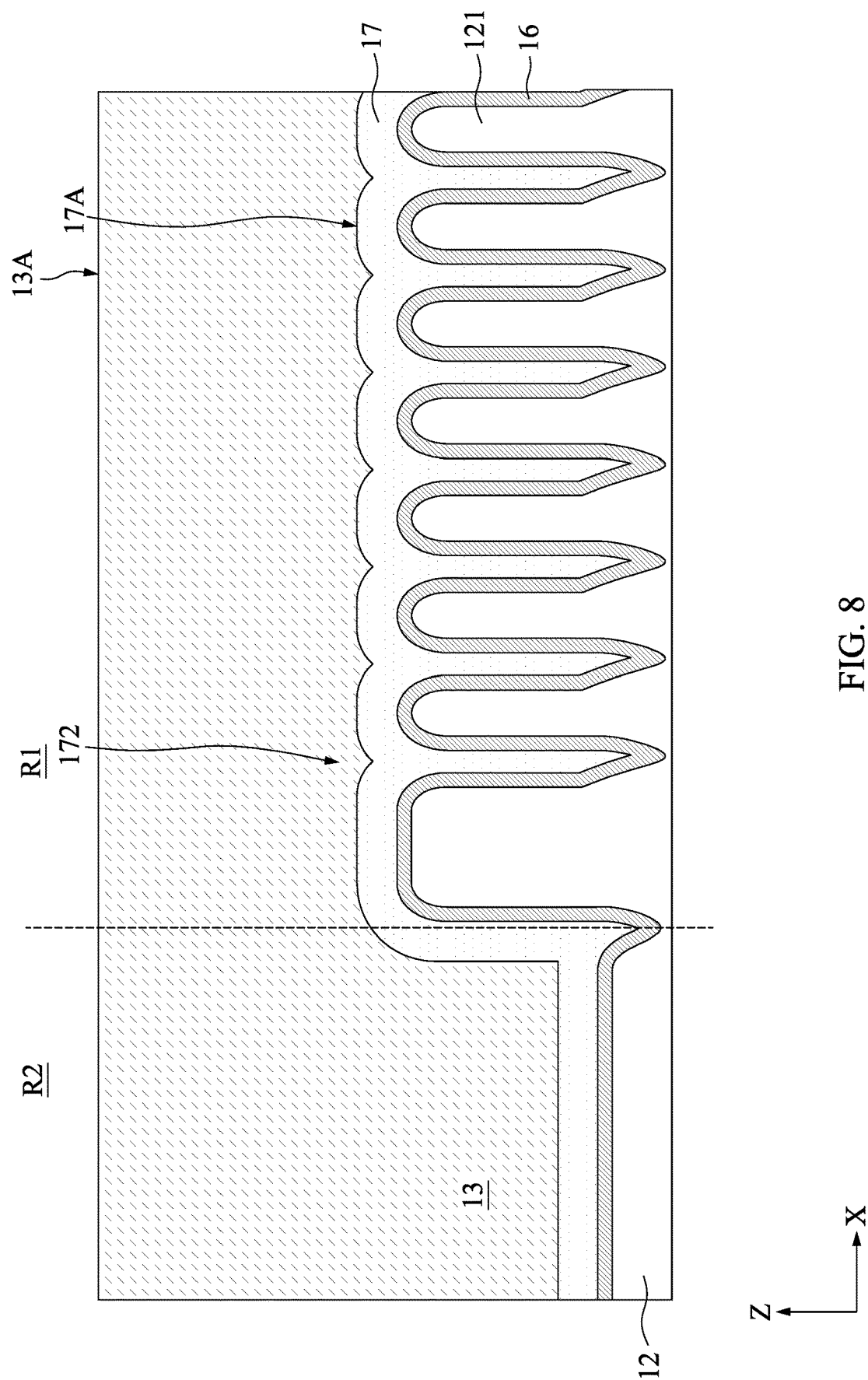

Referring to FIG. 8, a dielectric layer 13 is formed over the dielectric layer 17. In some embodiments, the dielectric layer 13 is in physical contact with the top surface 17A of the dielectric layer 17. In some embodiments, the dielectric layer 13 fills the recesses 172 of the dielectric layer 17. The dielectric layer 13 and the dielectric layer 17 are for a purpose of electrical isolation between elements. In some embodiments, the dielectric layers 13 and 17 can be considered as a dielectric structure. In some embodiments, the dielectric layers 13 and 17 can be considered as two sub-layers of a dielectric layer. In some embodiments, a top surface 13A of the dielectric layer 13 is substantially planar. In some embodiments, the dielectric layer 13 is configured to provide a planar surface for an etching operation or a polishing operation to be performed during subsequent processing in order to provide a better removal result. In some embodiments, the dielectric layer 13 includes a dielectric material, an anti-reflective coating material, an oxide-containing material, or other suitable materials. The dielectric layer 13 can include one or more dielectric materials selected from the dielectric materials described in reference to the dielectric layers 151 and 152, and repeated description is omitted herein. In some embodiments, the dielectric layer 13 includes a dielectric material different from that of the dielectric layer 17 for a purpose of etching selectivity.

Figure 9:
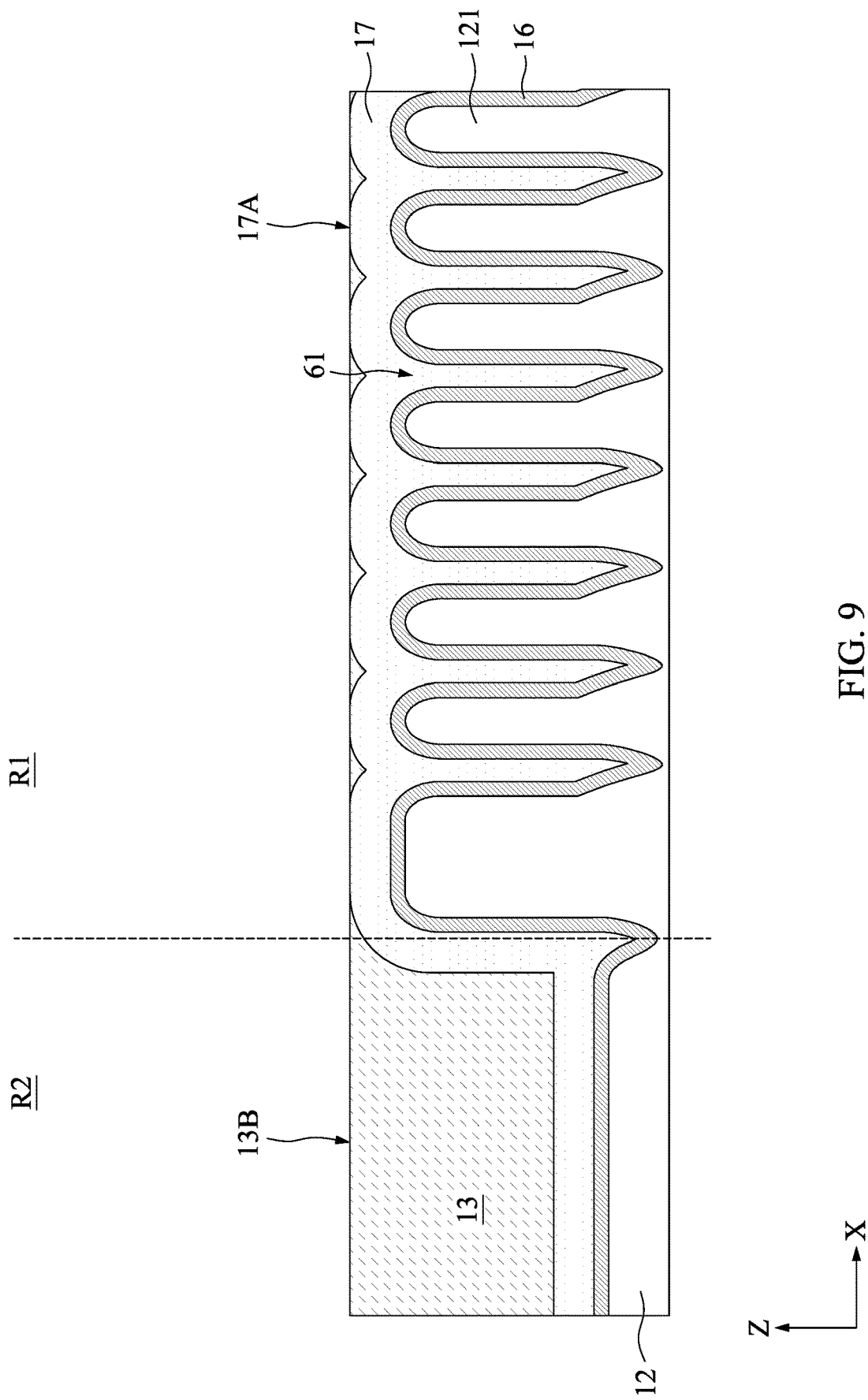

Referring to FIG. 9, the dielectric layer 13 above the dielectric layer 17 is removed. In some embodiments, a polishing operation is performed on the dielectric layer 13 and stops at the dielectric layer 17. In some embodiments, the polishing operation includes a chemical mechanical polishing (CMP) operation. In some embodiments, a slurry of the polishing operation has a high selectivity to the dielectric material of the dielectric layer 13 and a low selectivity to the dielectric material of the dielectric layer 17. In alternative embodiments, an etching operation is performed instead of the polishing operation, and the etching operation stops upon an exposure of the dielectric layer 17. In some embodiments, an etchant of the etching operation has a high selectivity to the dielectric material of the dielectric layer 13 and a low selectivity to the dielectric material of the dielectric layer 17. In some embodiments, the removal of the dielectric layer 13 above the dielectric layer 17 includes a polishing operation, an etching operation, or a combination thereof. In some embodiments, a surface 13B of the dielectric layer 13 is defined after the polishing (or etching) operation. In some embodiments, portions of the top surface 17A of the dielectric layer 17 are exposed through the dielectric layer 13. In some embodiments, the surface 13B of the dielectric layer 13 is substantially coplanar with the exposed portions of the top surface 17A of the dielectric layer 17.

Figure 10:
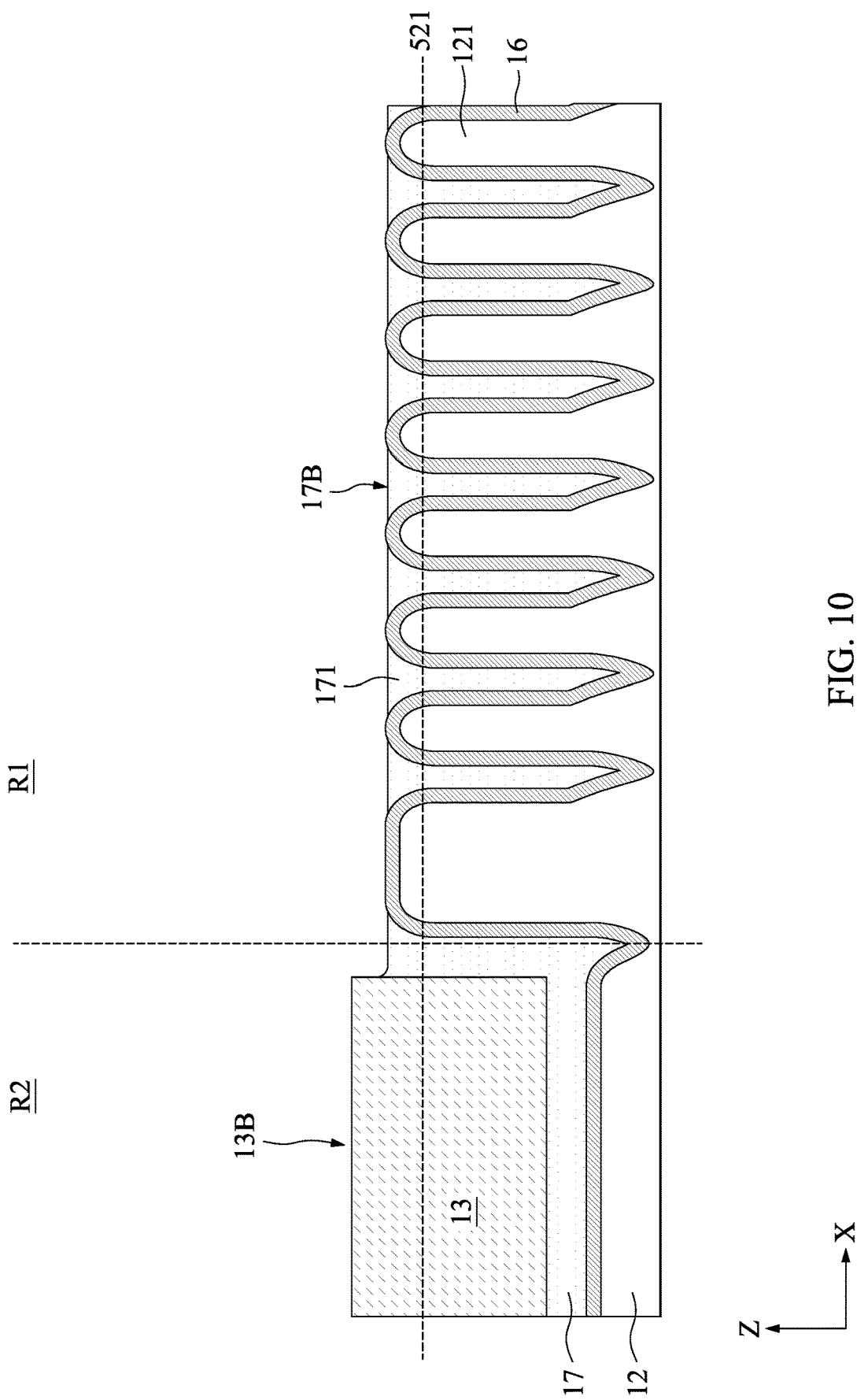

Referring to FIG. 10, the dielectric layer 17 above the oxide layer 16 and the silicon portions 121 is removed. In some embodiments, a polishing operation is performed on the dielectric layer 17 and stops at the oxide layer 16. In some embodiments, the polishing operation includes a CMP operation. In some embodiments, a slurry of the polishing operation has a high selectivity to the dielectric material of the dielectric layer 17 and a low selectivity to the oxide material of the oxide layer 16. In alternative embodiments, an etching operation is performed instead of the polishing operation, and the etching operation stops upon an exposure of the oxide layer 16. In some embodiments, an etchant of the etching operation has a high selectivity to the dielectric material of the dielectric layer 17 and a low selectivity to the oxide material of the oxide layer 16. In some embodiments, the removal of the dielectric layer 17 above the oxide layer 16 includes a polishing operation, an etching operation, or a combination thereof.

In some embodiments, the dielectric layer 13 includes an oxide material similar to or same as that of the oxide layer 16. In some embodiments, the slurry of the polishing operation or the etchant of the etching operation has a low selectivity to the material of the dielectric layer 13. Therefore, the surface 13B of the dielectric layer 13 in the peripheral region R2 remains during and after the removal of the dielectric layer 17 above the oxide layer 16 and the silicon portions 121.

In some embodiments, a surface 17B of the dielectric layer 17 is defined after the polishing (or etching) operation. In some embodiments, a plurality of dielectric portions 171 of the dielectric layer 17 are defined between the silicon portions 121. In some embodiments, top surfaces of the dielectric portions 171 together define the surface 17B of the dielectric layer 17. The plurality of the dielectric portions 171 shown in FIG. 10 may appear connected in a 3D diagram or a top view (not shown) depending on a pattern of the silicon portions 121. Portions of the oxide layer 16 above the silicon portions 121 may be exposed through the dielectric layer 17. In some embodiments, the exposed portions of the oxide layer 16 protrude from the surface 17B of the dielectric layer 17 as shown in FIG. 10. In other words, the surface 17B is below tops of the exposed portions of the oxide layer 16. In some embodiments, the surface 17B of the dielectric layer 17 is substantially coplanar with the exposed portions of the oxide layer 16 (not shown). In some embodiments, the surface 17B of the dielectric layer 17 is above the line 521.

Figure 11:
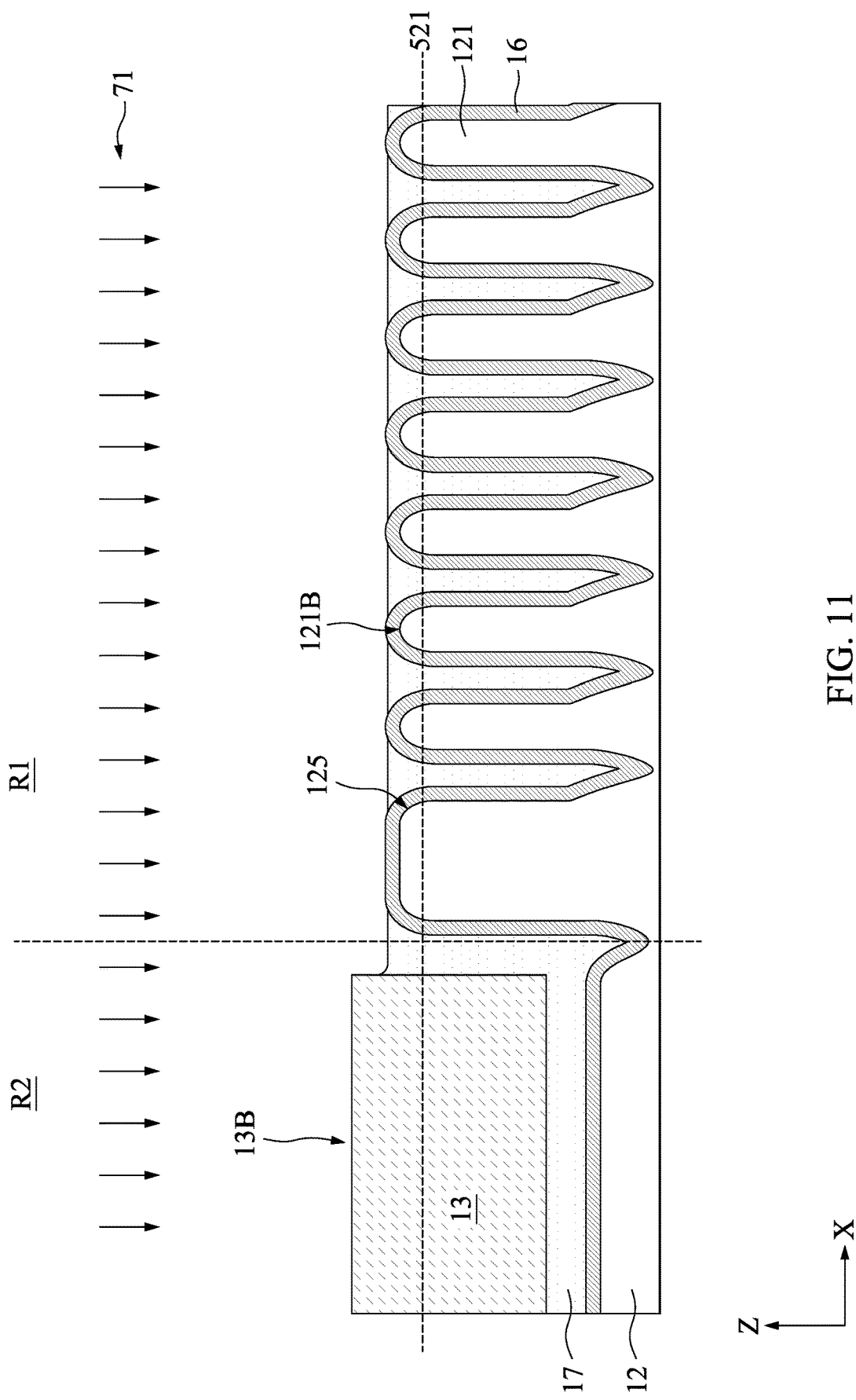

Referring to FIG. 11, a planarization 71 is performed on the dielectric layers 13, 16 and 17 and the silicon portions 121. The planarization 71 functions to remove the dielectric layers 13, 16 and 17 and the silicon portions 121 above the line 521. In some embodiments, the planarization 71 includes an etching operation, such as ion beam etching, directional dry etching, reactive ion etching, solution wet etching, or a combination thereof. In some embodiments, the planarization 71 includes a low-selectivity etching. In some embodiments, the low-selectivity etching includes a low etching selectivity among materials of the dielectric layers 13, 16 and 17 and the substrate 12. In some embodiments, the planarization includes a polishing operation (e.g., a CMP operation). In some embodiments, the planarization includes a polishing operation and an etching operation. In some embodiments, the polishing operation and/or the etching operation include a solvent having a high selectivity to silicon. In some embodiments, the planarization 71 is a time-mode operation. A duration of the time-mode planarization 71 is controlled so that the time-mode planarization 71 is performed until the dielectric layers 13, 16 and 17 and the silicon portions 121 above the line 521 are removed. In some embodiments, the planarization 71 stops at the line 521. In some embodiments, the planarization 71 stops below the line 521 to ensure that the convex surface 121B is entirely removed.

Figure 12:
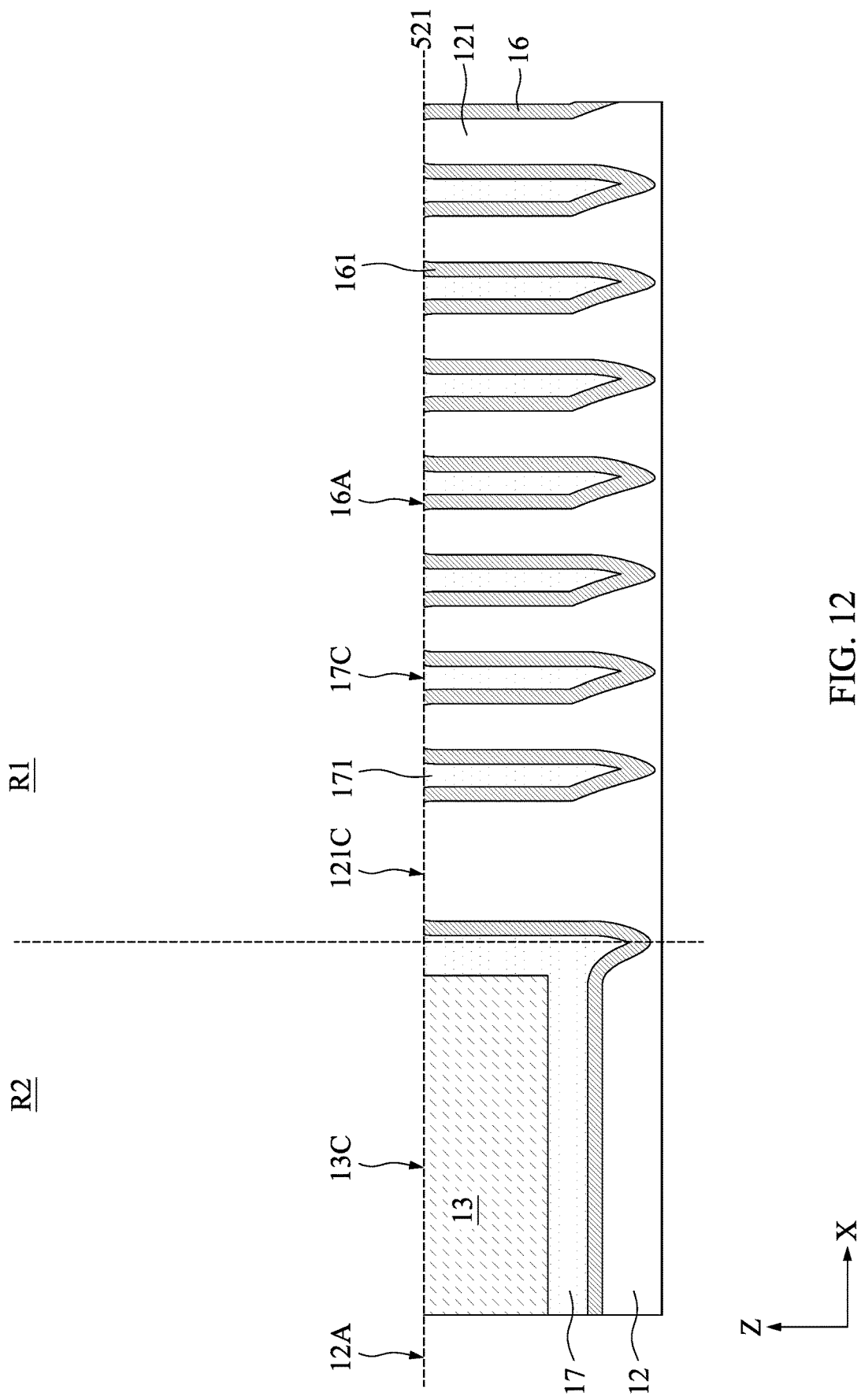

Referring to FIG. 12, FIG. 12 shows a result of the planarization 71. In some embodiments, a height of the dielectric portions 171 of the dielectric layer 17 is reduced. In some embodiments, top surfaces 17C of the dielectric portions 171 are at or below an elevation of the line 521. The plurality of the dielectric portions 171 shown in FIG. 12 may appear connected in a 3D diagram or a top view (not shown) depending on a pattern of the silicon portions 121. In some embodiments, portions of the oxide layer 16 above the line 521 are removed by the planarization 71 to form a plurality of oxide portions 161 surrounding each of the silicon portions 121. The plurality of the oxide portions 161 shown in FIG. 12 may appear connected in a 3D diagram or from a top-view perspective (not shown) depending on the pattern of the silicon portions 121. In some embodiments, a top surface 16C of the dielectric layer 16 is defined after the planarization 71 in FIG. 11. In some embodiments, the top surface 16C is defined by top surfaces of the plurality of the oxide portions 161. In some embodiments, top surfaces 121C of the silicon portions 121 of the substrate 12 are defined after the planarization 71 in FIG. 11. In some embodiments, a top surface 13C of the dielectric layer 13 is defined in the peripheral region R2 after the planarization 71 in FIG. 11. In some embodiments, the top surface 13C of the dielectric layer 13, the top surfaces 121C of the silicon portions 121, the top surfaces 161A of the oxide portions 161, and the top surfaces 17C of the dielectric portions 171 are coplanar with one another. In some embodiments, the top surface 13C of the dielectric layer 13, the top surfaces 121C of the silicon portions 121, the top surfaces 161A of the oxide portions 161, and the top surface 17C of the dielectric portions 171 are substantially coplanar. The top surface 13C of the dielectric layer 13, the top surfaces 121C of the silicon portions 121, the top surfaces 161A of the oxide portions 161, and the top surfaces 17C of the dielectric portions 171 together define a surface 12A. In some embodiments, the surface 12A is a planar surface.

Figure 13:
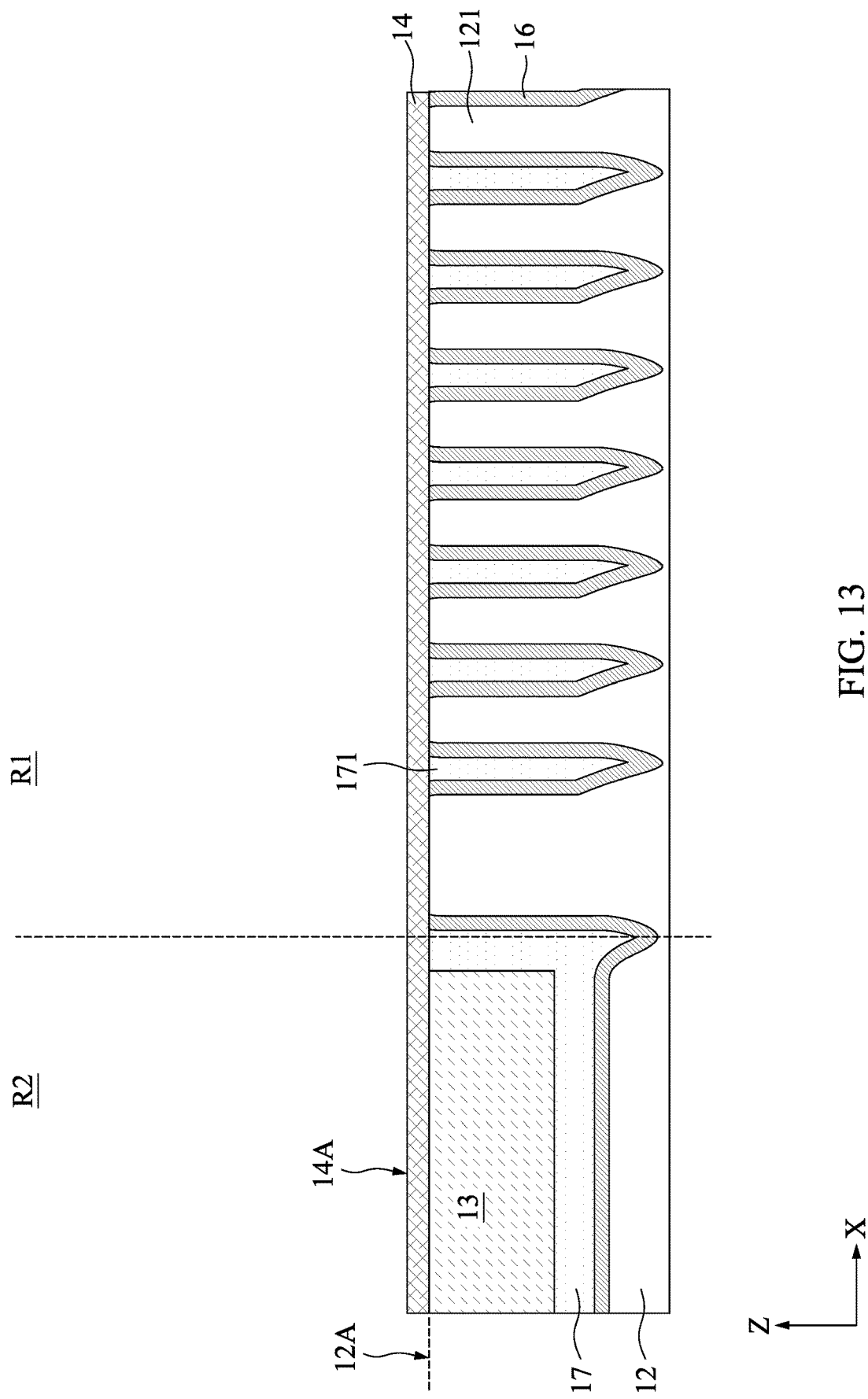

Referring to FIG. 13, an insulating layer 14 may be formed on the surface 12A over the dielectric portions 171, the oxide portions 161, the silicon portions 121, and the dielectric layer 13. The insulating layer 14 includes one or more dielectric materials. In some embodiments, the insulating layer 14 is referred to as a dielectric layer 14. In some embodiments, the insulating layer 14 contacts the dielectric portions 171, the oxide portions 161, the silicon portions 121, and the dielectric layer 13. In some embodiments, the insulating layer 14 is formed in the array region R1 and the peripheral region R2. Since the surface 12A is a substantially planar surface, a top surface 14A of the insulating layer 14 formed on the surface 12A is a substantially planar surface. In some embodiments, the insulating layer 14 includes nitride, such as silicon nitride. In some embodiments, the insulating layer 14 is formed using a CVD process, a PVD, or any other suitable process. In some embodiments, a thickness of the insulating layer 14 is in a range of 5 to 30 nm.

Figure 14:
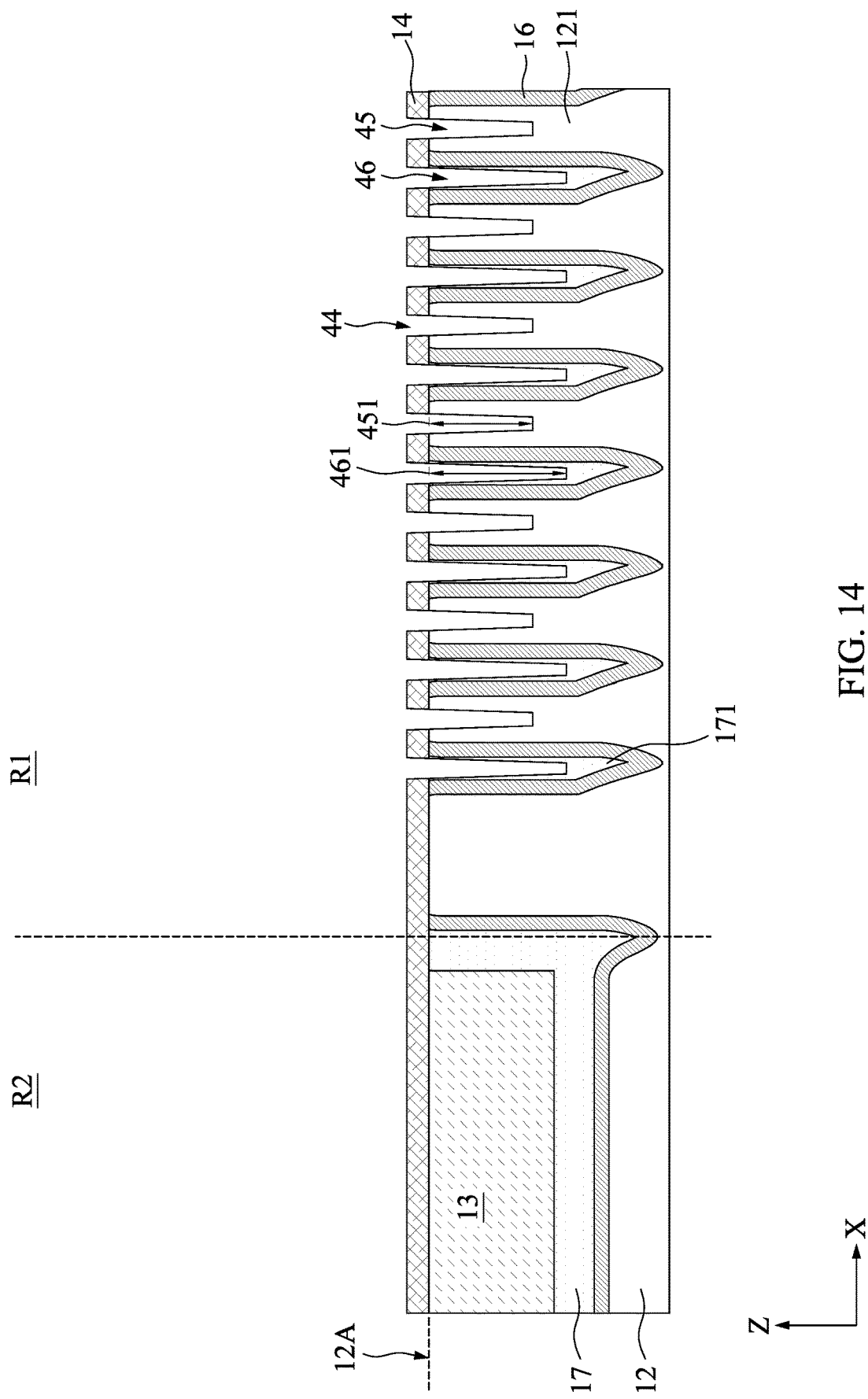

Referring to FIG. 14, a patterning operation is performed. The substrate 12 in the array region R1 and the dielectric portions 171 are partially removed by the patterning operation. The patterning operation can include one or multiple steps, and the insulating layer 14, the dielectric layer 17 and the silicon portions 121 can be patterned concurrently by one etching step or sequentially by different etching steps depending on the materials of the insulating layer 14, the dielectric layer 17 and the silicon portions 121. In some embodiments, a plurality of openings 44, a plurality of trenches 45 and a plurality of trenches 46 are formed by the patterning operation. In some embodiments, each of the openings 44 penetrates and is surrounded by the insulating layer 14. In some embodiments, the openings 44 are defined by the insulating layer 14. In some embodiments, the trenches 45 are defined by the silicon portions 121 of the substrate 12. In some embodiments, each of the trenches 45 is formed in a silicon portion 121. In some embodiments, the trenches 46 are defined by the dielectric portions 171. In some embodiments, each of the trenches 46 is formed in a dielectric portion 171.

Depths of the trenches 45 may be substantially equal, and depths of the trenches 46 may be substantially equal. In some embodiments, a depth 451 of the trench 45 measured from the surface 12A is different from a depth 461 of the trench 46 measured from the surface 12A. In some embodiments, the depth 451 of the trench 45 is substantially less than the depth 461 of the trench 46. In some embodiments, a difference between the depth 451 and the depth 461 is due to different etching rates on different materials during one etching step of the patterning operation. In some embodiments, the trenches 45 and the trenches 46 are formed by different etching steps, and the depths 451 and the depths 461 are controlled to be different for a purpose of formation of WL metals performed during subsequent processing.

Figure 15:
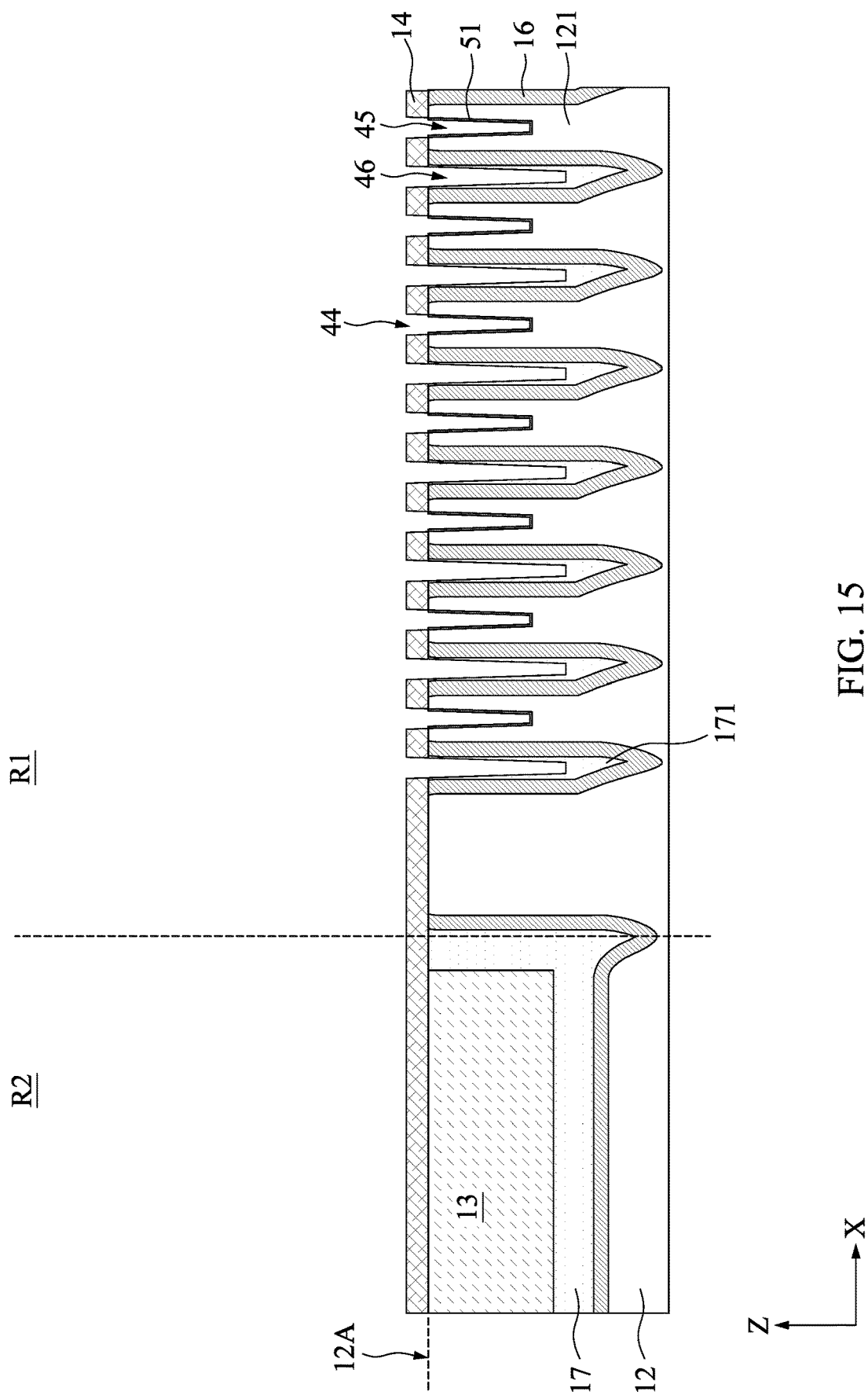

Referring to FIG. 15, a dielectric layer 51 lining each of the trenches 45 is formed. In some embodiments, the dielectric layer 51 is formed only in the trenches 45. In some embodiments, the dielectric layer 51 contacts the silicon portions 121. In some embodiments, the dielectric layer 51 is formed by a thermal oxidation. In some embodiments, the dielectric layer 51 includes silicon oxide.

Figure 16:
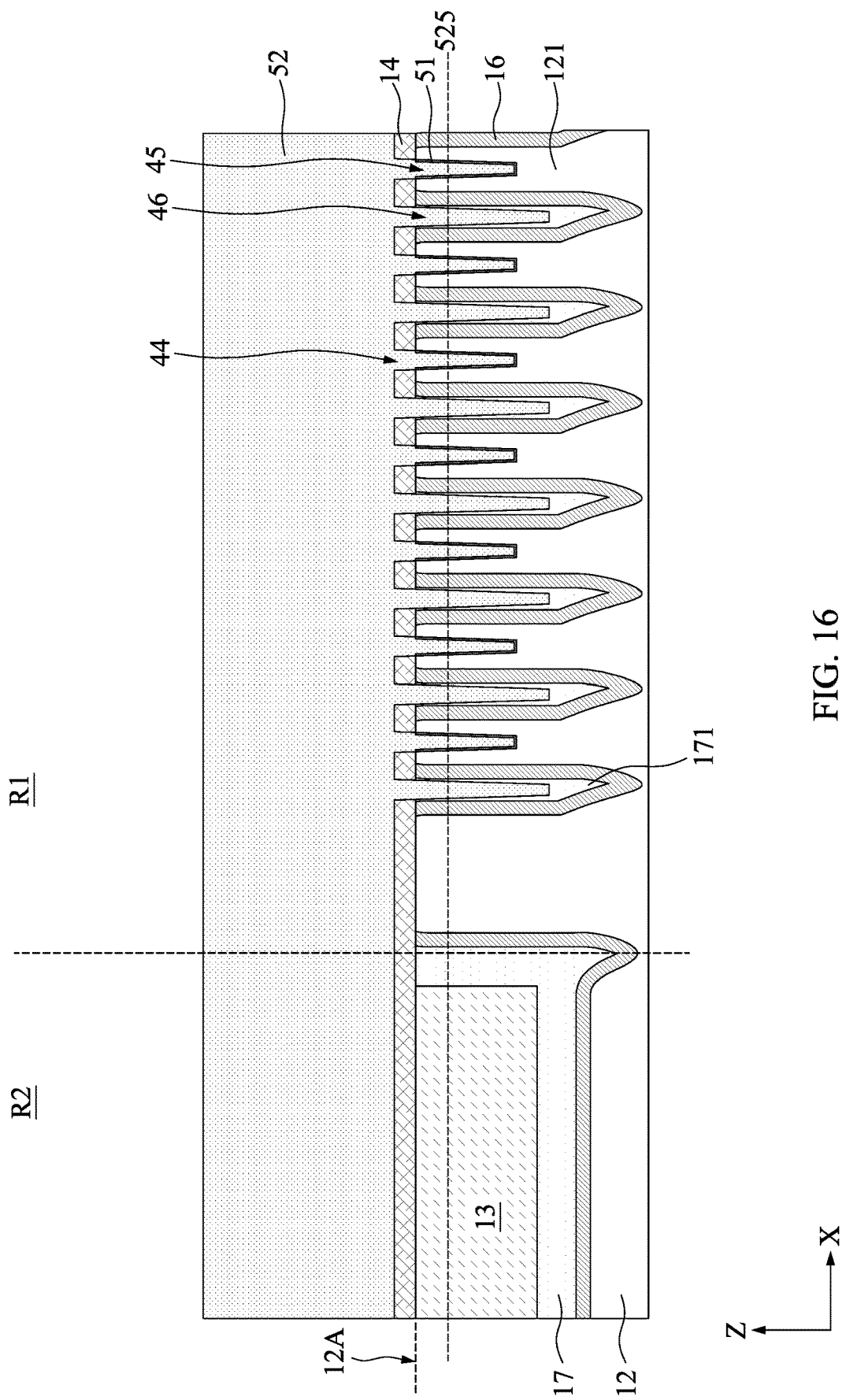

Referring to FIG. 16, a conductive material 52 is formed over the substrate 12 and the patterned insulating layer 14. The conductive material 52 may fill the openings 44 and the trenches 45 and 46. In some embodiments, the conductive material 52 fills an entirety of the trenches 45 and 46. In some embodiments, the conductive material 52 is formed by a deposition. In some embodiments, the conductive material 52 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the conductive material 52 is W, TiN, or a combination thereof.

Figure 17:
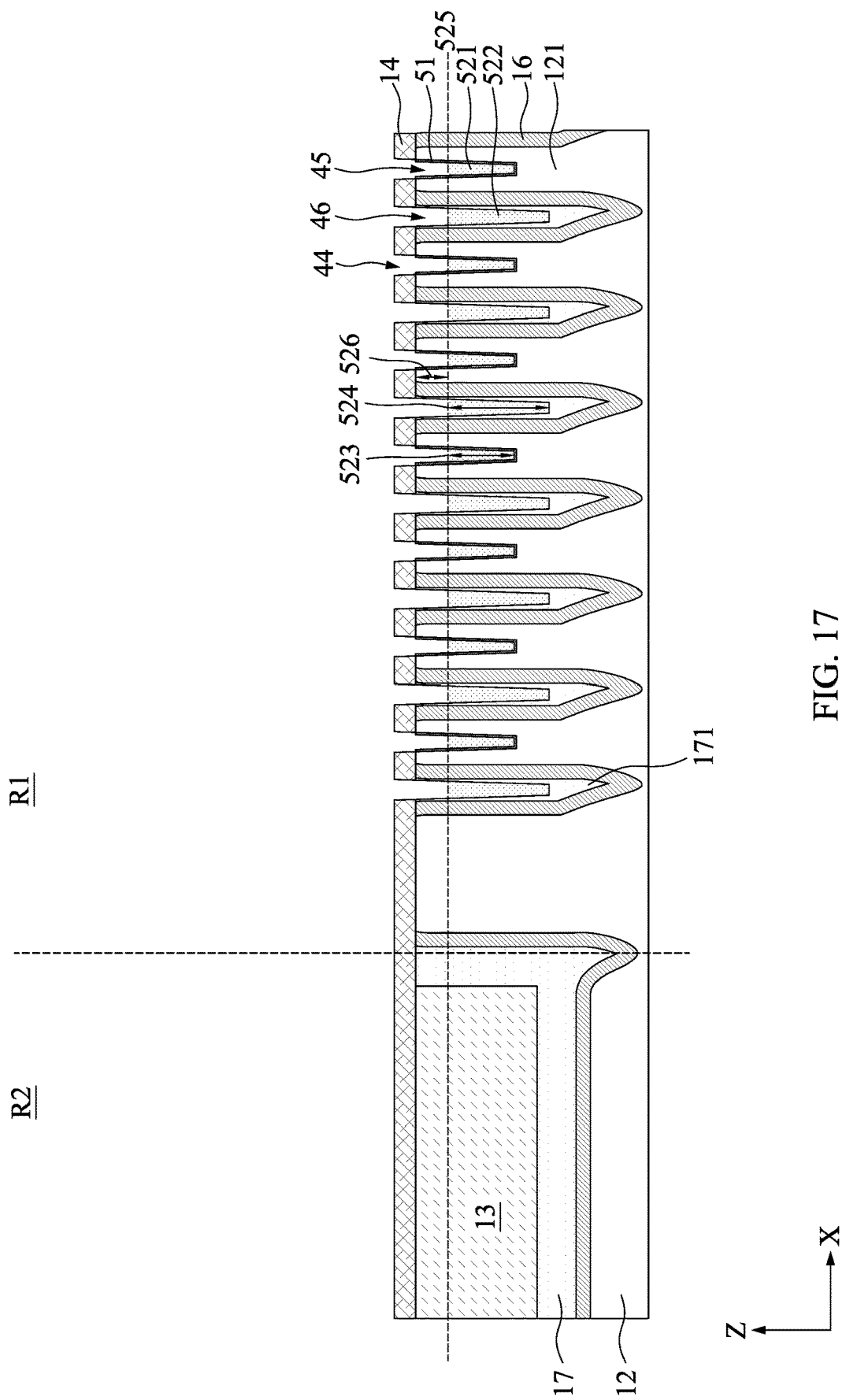

Referring to FIG. 17, an upper portion of the conductive material 52 is removed. In some embodiments, a plurality of contacts 521 are formed in the trenches 45 and a plurality of contacts 522 are formed in the trenches 46. In some embodiments, the contacts 521 and 522 are referred to as WL metals.

Referring back to FIG. 16, a dashed line labeled 525 indicates a designed top surface of the contacts 521 and 522 shown in FIG. 17. For a purpose of electrical connection, the designed top surface 525 should be below the surface 12A (or a top surface of the substrate 12). In other words, a distance 526 from the surface 12A to the designed top surface 525 should be greater than zero. However, a range of the distance 526 can be adjusted according to different applications, and the distance 526 is not limited herein. In addition, it should be noted that the figures are for a purpose of illustration, and tops of different contacts 521 and/or 522 can be at roughly a same elevation but not necessarily at a same horizontal level. In some embodiments, a height 523 of the contacts 521 and a height 524 of the contacts 522 from the designed top surface 525 are different due to different depths 451 and 461 of the trenches 45 and 46 shown in FIG. 14. In some embodiments, the height 523 of the contacts 521 is substantially less than the height 524 of the contacts 522 from the designed top surface 525.

Figure 18:
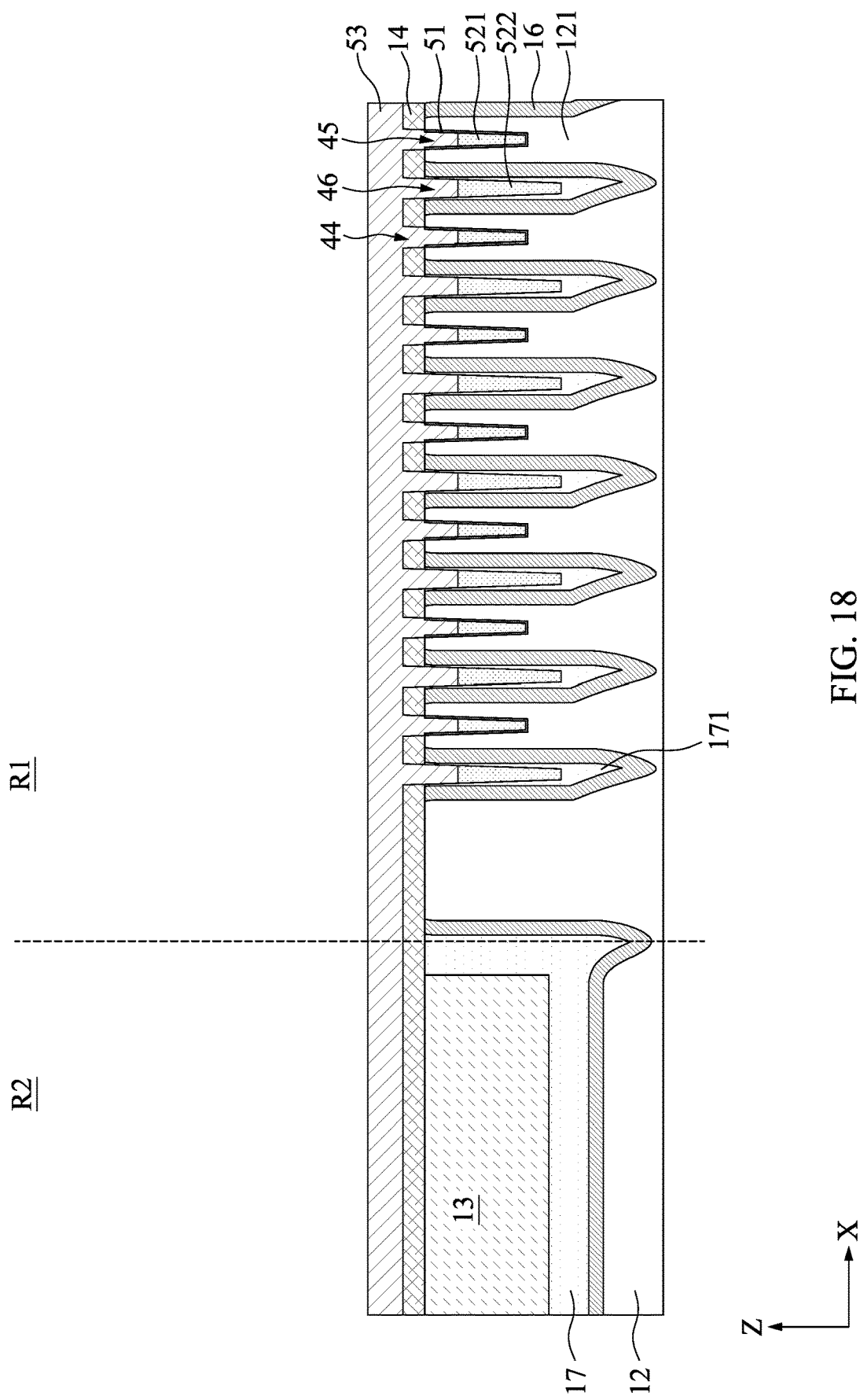
Figure 19:
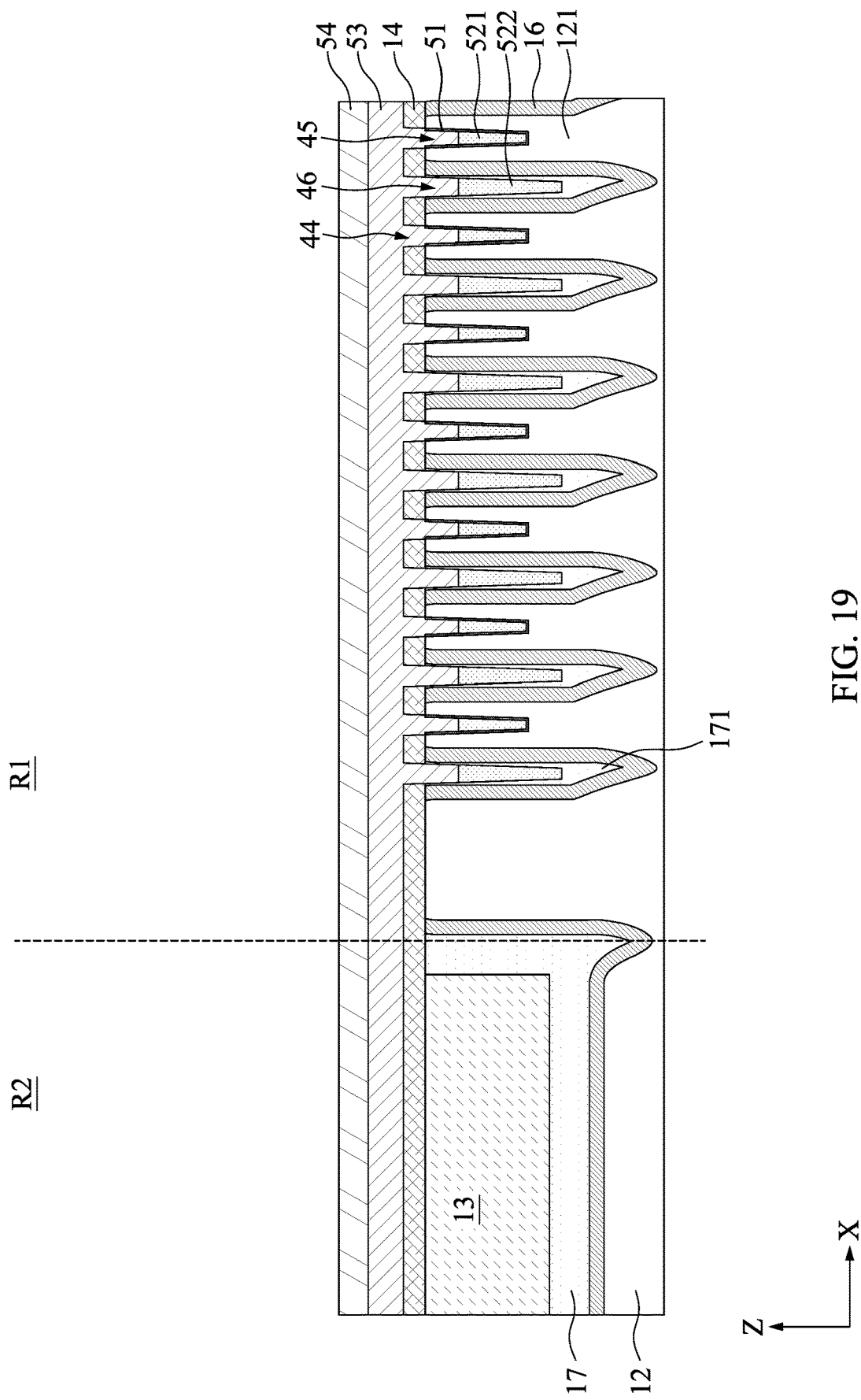

Referring to FIGS. 18 and 19, a first dielectric layer 53 and a second dielectric layer 54 are sequentially formed over the substrate 12. Each of the first dielectric layer 53 and the second dielectric layer 54 may cover the contacts 521 and 522 and the patterned insulating layer 14. In some embodiments, the first dielectric layer 53 and the second dielectric layer 54 include different dielectric materials. In some embodiments, the first dielectric layer 53 includes nitride (e.g., silicon nitride), and the second dielectric layer 54 includes oxide (e.g., silicon oxide). In some embodiments, the first dielectric layer 53 fills the trenches 45 above the contacts 521. In some embodiments, the first dielectric layer 53 fills the trenches 46 above the contacts 522. In some embodiments, the first dielectric layer 53 fills the openings 44. In some embodiments, the first dielectric layer 53 covers an entirety of the patterned insulating layer 14. In some embodiments, the second dielectric layer 54 covers an entirety of the first dielectric layer 53. The semiconductor structure 10 is thereby formed.

Bit line (BL) metals may be formed over the semiconductor structure 10 shown in FIG. 19. In some embodiments, landing pads are formed after the BL metals to electrically connect with the silicon portions 121 in the array region R1. The present disclosure provides the silicon portions 121 having planar top surfaces respectively, and thus issues of the electrical disconnection or high electric resistance between a silicon pillar and a landing pad resulted from the rounding of the silicon pillar can be prevented. A performance of a device formed according to the method and a product yield can be thereby improved.

To conclude the operations as illustrated in FIGS. 1 to 19 above, a method S1 and a method S2 within a same concept of the present disclosure are provided.

Figure 20:
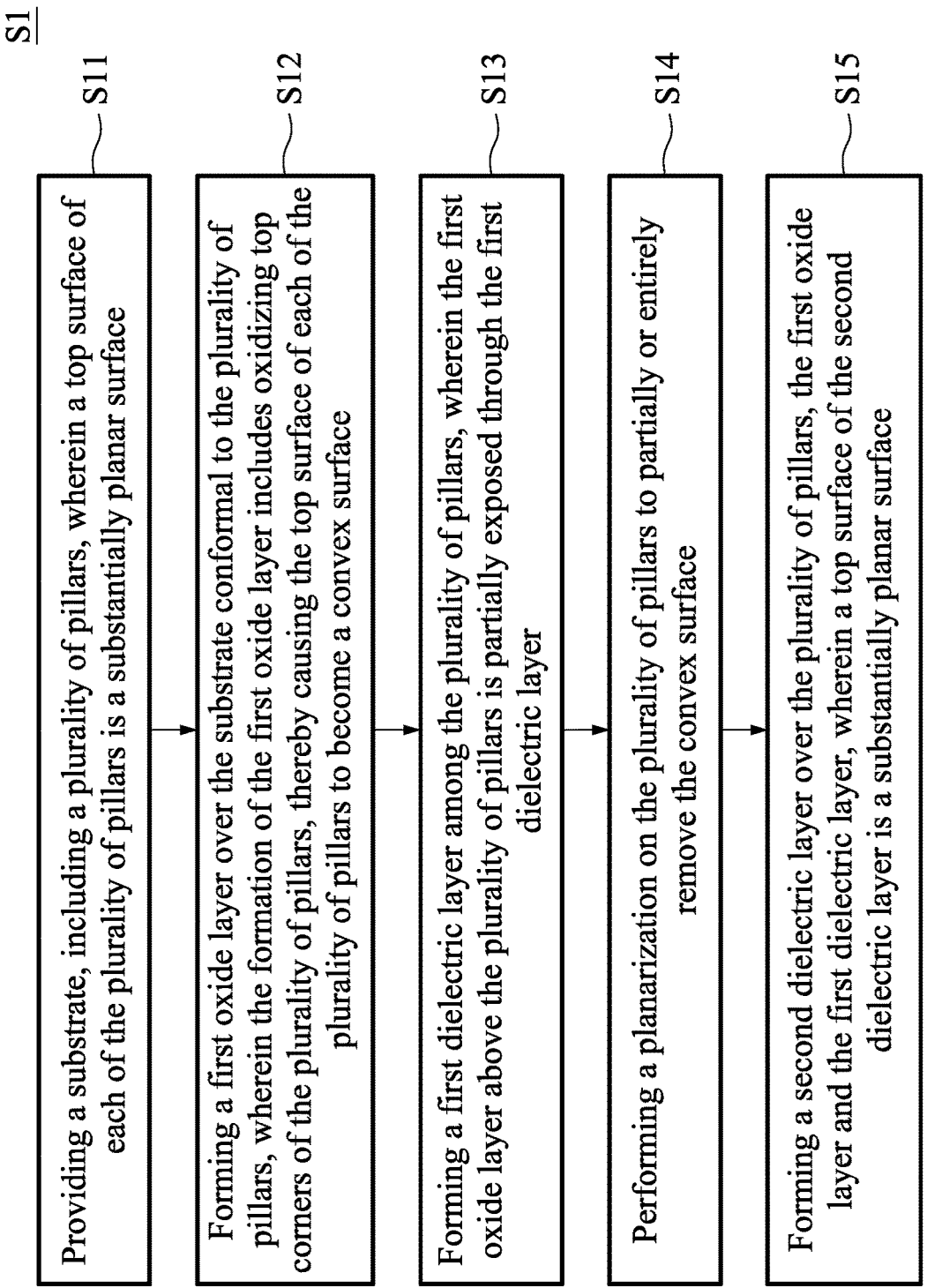
FIG. 20 is a flow diagram illustrating a method of manufacturing a semiconductor structure in accordance with some embodiments of the present disclosure.

FIG. 20 is a flow diagram illustrating a method S1 for manufacturing a semiconductor device in accordance with some embodiments of the present disclosure. The method S1 includes a number of operations (S11, S12, S13, S14 and S15) and the description and illustration are not deemed as a limitation to the sequence of the operations. In the operation S11, a substrate is provided, wherein the substrate includes a plurality of pillars, and a top surface of each of the plurality of pillars is a substantially planar surface. In the operation S12, a first oxide layer is formed over the substrate conformal to the plurality of pillars, wherein the formation of the first oxide layer includes oxidizing top corners of the plurality of pillars, thereby causing the top surface of each of the plurality of pillars to become a convex surface. In the operation S13, a first dielectric layer is formed among the plurality of pillars, wherein the first oxide layer above the plurality of pillars is partially exposed through the first dielectric layer. In the operation S14, a planarization is performed on the plurality of pillars to partially or entirely remove the convex surfaces. In the operation S15, a second dielectric layer is formed over the plurality of pillars, the first oxide layer and the first dielectric layer, wherein a top surface of the second dielectric layer is a substantially planar surface. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

Figure 21:
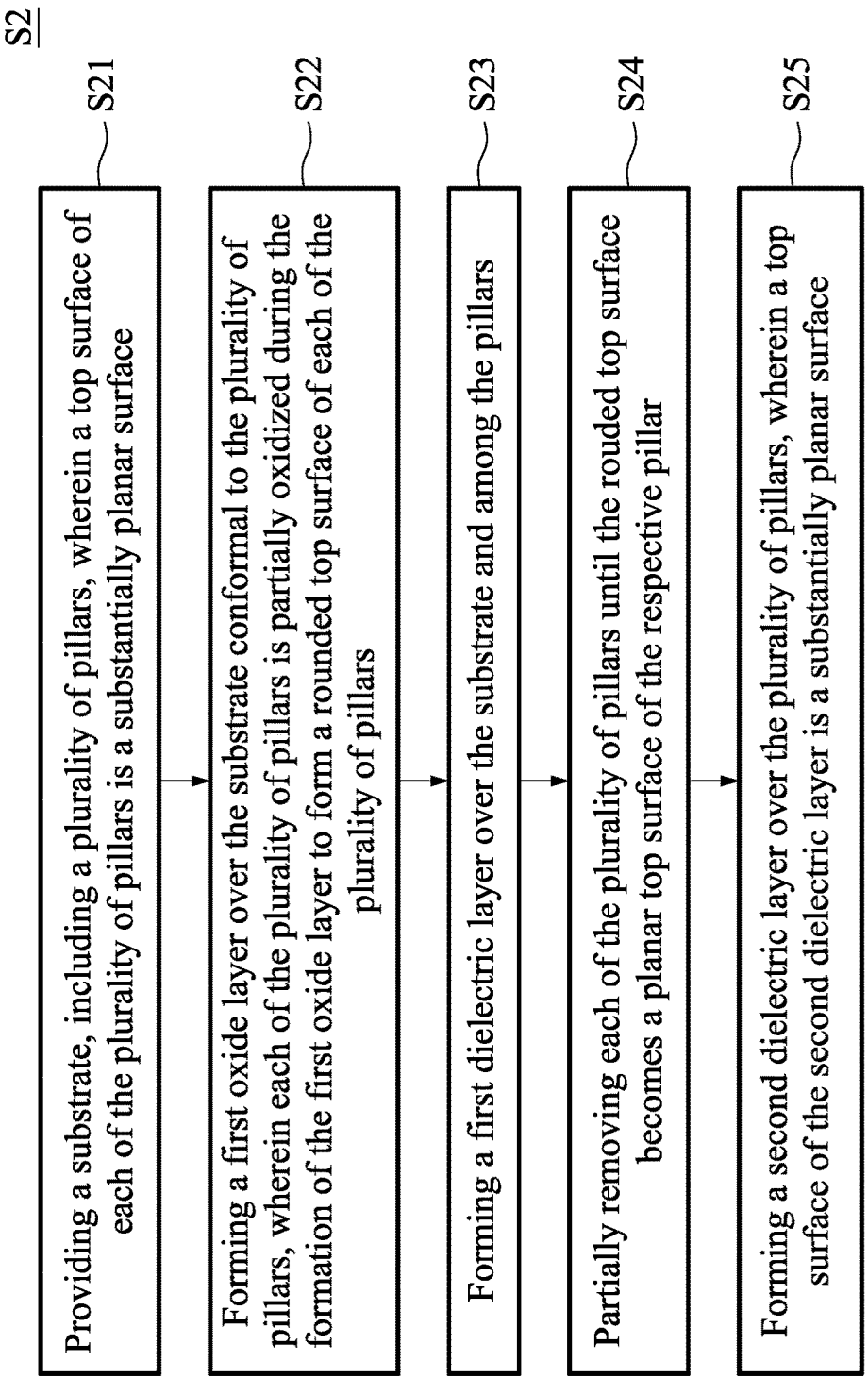
FIG. 21 is a flow diagram illustrating a method of manufacturing a semiconductor structure in accordance with some embodiments of the present disclosure.

FIG. 21 is a flow diagram illustrating a method S2 for manufacturing a semiconductor device in accordance with some embodiments of the present disclosure. The method S2 includes a number of operations (S21, S22, S23, S24 and S25) and the description and illustration are not deemed as a limitation to the sequence of the operations. In the operation S21, a substrate is provided, wherein the substrate includes a plurality of pillars, and a top surface of each of the plurality of pillars is a substantially planar surface. In the operation S22, a first oxide layer is formed over the substrate conformal to the plurality of pillars, wherein each of the plurality of pillars is partially oxidized during the formation of the first oxide layer to form a rounded top surface of each of the plurality of pillars. In the operation S23, a first dielectric layer is formed over the substrate and among the pillars. In the operation S24, each of the plurality of pillars is partially removed until the rounded top surface becomes a planar top surface of the respective pillar. In the operation S25, a second dielectric layer is formed over the plurality of pillars, wherein a top surface of the second dielectric layer is a substantially planar surface. It should be noted that the operations of the method S2 may be rearranged or otherwise modified within the scope of the various aspects. Additional processes may be provided before, during, and after the method S2, and some other processes may be only briefly described herein. Thus, other implementations are possible within the scope of the various aspects described herein.

The method S1 and the method S2 are within a same concept of the present disclosure, and in order to further illustrate details of the method S1 and the method S2, and the concept of the present disclosure, the method S1 and the method S2 are comprehensively described with embodiments of the present disclosure as above.

Therefore, the present disclosure provides a manufacturing method and a semiconductor structure thereof. The manufacturing method of the present disclosure is able to provide a planar surface of a silicon pillar so as to avoid issues of electrical disconnection and high electric resistance. A performance of a device formed according to the method and a product yield can be thereby improved.

One aspect of the present disclosure provides a method for manufacturing a semiconductor structure. The method includes a number of operations. A substrate is provided, wherein the substrate includes a plurality of pillars, and a top surface of each of the plurality of pillars is a substantially planar surface. A first oxide layer is formed over the substrate conformal to the plurality of pillars, wherein the formation of the first oxide layer includes oxidizing top corners of the plurality of pillars, thereby causing the top surface of each of the plurality of pillars to become a convex surface. A first dielectric layer is formed among the plurality of pillars, wherein the first oxide layer above the plurality of pillars is partially exposed through the first dielectric layer. A planarization is performed on the plurality of pillars to partially or entirely remove the convex surface. A second dielectric layer is formed over the plurality of pillars, the first oxide layer and the first dielectric layer, wherein a top surface of the second dielectric layer is a substantially planar surface.

In some embodiments, the formation of the first dielectric layer comprises: forming a first sub-layer over the substrate and among the plurality pillars; forming a second sub-layer over the first sub-layer; and removing the first sub-layer and the second sub-layer above the first oxide layer.

In some embodiments, the first sub-layer and the second sub-layer include different dielectric materials.

In some embodiments, the first sub-layer includes nitride, and the second sub-layer includes oxide.

In some embodiments, the removal of the first sub-layer and the second sub-layer comprises: removing the second sub-layer above the first sub-layer; and removing the first sub-layer above the first oxide layer.

In some embodiments, the removal of the second sub-layer includes a polishing operation having a high selectivity to the second sub-layer.

In some embodiments, the removal of the first sub-layer includes a polishing operation, an etching operation, or a combination thereof, and the removal of the first sub-layer has a high selectivity to the first sub-layer.

In some embodiments, the planarization partially removes each of the plurality of pillars and the first oxide layer.

In some embodiments, a top surface of the first oxide layer and the top surface of each of the plurality of pillars are substantially coplanar after the planarization.

In some embodiments, the providing of the substrate comprises: receiving a bulk substrate; forming a third dielectric layer over the bulk substrate; forming a fourth dielectric layer over the third dielectric layer; patterning the third dielectric layer, the fourth dielectric layer and the bulk substrate to form the plurality of pillars and remaining portions of the third dielectric layer and fourth dielectric layer over each of the pillars; and removing the remaining portions of the third dielectric layer and the fourth dielectric layer.

In some embodiments, the second dielectric layer includes nitride.

In some embodiments, the method further includes: forming a plurality of first trenches in the plurality of pillars and forming a plurality of second trenches in the first dielectric layer between the pillars.

In some embodiments, the method further includes: filling the plurality of first trenches and the plurality of second trenches with a conductive material.

In some embodiments, the method further includes: forming a second oxide layer conformal to each of the plurality of first trenches prior to the filling of the plurality of first trenches and the plurality of the second trenches with the conductive material.

In some embodiments, the second oxide layer is formed by an oxidation.

Another aspect of the present disclosure provides a method for manufacturing a semiconductor structure. The method includes a number of operations. A substrate is provided, wherein the substrate includes a plurality of pillars, and a top surface of each of the plurality of pillars is a substantially planar surface. A first oxide layer is formed over the substrate conformal to the plurality of pillars, wherein each of the plurality of pillars is partially oxidized during the formation of the first oxide layer to form a rounded top surface of each of the plurality of pillars. A first dielectric layer is formed over the substrate and among the pillars. Each of the plurality of pillars is partially removed until the rounded top surface becomes a planar top surface of the respective pillar. A second dielectric layer is formed over the plurality of pillars, wherein a top surface of the second dielectric layer is a substantially planar surface.

In some embodiments, the formation of the first dielectric layer comprises: forming a first sub-layer over the first oxide layer and among the pillars; forming a second sub-layer over the first sub-layer; and removing the first sub-layer and the second sub-layer above the first oxide layer.

In some embodiments, the first sub-layer and the second sub-layer include different dielectric materials.

In some embodiments, the first sub-layer includes nitride and the second sub-layer includes oxide.

In some embodiments, the removal of the first sub-layer and the second sub-layer comprises: performing a polishing operation on the second sub-layer until the first sub-layer is exposed; and performing an etching operation on the first sub-layer until the first oxide layer is exposed.

In some embodiments, the polishing operation includes using a slurry with a high selectivity to the second sub-layer.

In some embodiments, the etching operation includes using an etchant with a high selectivity to the first sub-layer and a low selectivity to the second sub-layer.

In some embodiments, the first oxide layer is partially removed during the partial removal of each of the plurality of pillars.

In some embodiments, a solvent is used in the partial removal of each of the plurality of pillars, and the solvent has a high selectivity to silicon.

In some embodiments, a top surface of the first oxide layer and the top surfaces of the plurality of pillars are substantially coplanar after the partial removal of each of the plurality of pillars.

In some embodiments, the second dielectric layer includes nitride.

In some embodiments, the method further includes: forming a plurality of first trenches in the plurality of pillars and forming a plurality of second trenches in the first dielectric layer among the pillars.

In some embodiments, the method further includes: filling the plurality of first trenches and the plurality of second trenches with a conductive material to form a plurality of contacts.

In some embodiments, a top surface of each of the plurality of contacts is below the top surface of each of the plurality of pillars.

In some embodiments, the method further includes: forming a third dielectric layer over the plurality of contacts; and forming a fourth dielectric layer over the third dielectric layer.

In some embodiments, the third dielectric layer fills the plurality of first trenches and the plurality of second trenches above the plurality of contacts.

Another aspect of the present disclosure provides a semiconductor structure. The semiconductor structure includes a substrate, a first dielectric layer, a plurality of first contacts, and a plurality of second contacts. The substrate includes a plurality of pillars in an array region of the substrate, wherein a top surface of each of the plurality of pillars is a substantially planar surface. The first dielectric layer surrounds each of the plurality of pillars, wherein a top surface of the first dielectric layer is substantially coplanar with the top surface of each of the plurality of pillars. The plurality of first contacts are disposed in the pillars. The plurality of second contacts are disposed between the pillars and surrounded by the first dielectric layer.

In some embodiments, a depth of the plurality of first contacts is substantially less than a depth of the plurality of second contacts.

In some embodiments, the second contacts and the first contacts are alternately arranged.

In some embodiments, the semiconductor structure further includes a second dielectric layer, disposed among the plurality of first contacts and the pillars.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for manufacturing a semiconductor structure, comprising:
providing a substrate, including a plurality of pillars, wherein a top surface of each of the plurality of pillars is a substantially planar surface;
forming a first oxide layer over the substrate conformal to the plurality of pillars, wherein the formation of the first oxide layer includes oxidizing top corners of the plurality of pillars, thereby causing the top surface of each of the plurality of pillars to become a convex surface;
forming a first dielectric layer among the plurality of pillars, wherein the first oxide layer above the plurality of pillars is partially exposed through the first dielectric layer;
performing a planarization on the plurality of pillars to partially or entirely remove the convex surface; and
forming a second dielectric layer over the plurality of pillars, the first oxide layer and the first dielectric layer, wherein a top surface of the second dielectric layer is a substantially planar surface.

2. The method of claim 1, wherein the formation of the first dielectric layer comprises:
forming a first sub-layer over the substrate and among the plurality of pillars;
forming a second sub-layer over the first sub-layer; and
removing the first sub-layer and the second sub-layer above the first oxide layer.

3. The method of claim 2, wherein the first sub-layer and the second sub-layer include different dielectric materials.

4. The method of claim 2, wherein the first sub-layer includes nitride, and the second sub-layer includes oxide.

5. The method of claim 2, wherein the removal of the first sub-layer and the second sub-layer comprises:
removing the second sub-layer above the first sub-layer; and
removing the first sub-layer above the first oxide layer.

6. The method of claim 5, wherein the removal of the second sub-layer above the first sub-layer includes a polishing operation having a high selectivity to the second sub-layer.

7. The method of claim 5, wherein the removal of the first sub-layer includes a polishing operation, an etching operation, or a combination thereof, and the polishing operation, the etching operation, or the combination thereof has a high-selectivity to the first sub-layer.

8. The method of claim 1, wherein the planarization partially removes each of the plurality of pillars and the first oxide layer.

9. The method of claim 8, wherein a top surface of the first oxide layer and the top surface of each of the plurality of pillars are substantially coplanar after the planarization.

10. The method of claim 1, wherein the providing of the substrate comprises:
receiving a bulk substrate;
forming a third dielectric layer over the bulk substrate;
forming a fourth dielectric layer over the third dielectric layer;
patterning the third dielectric layer, the fourth dielectric layer and the bulk substrate to form the plurality of pillars and remaining portions of the third dielectric layer and fourth dielectric layer over each of the pillars; and
removing the remaining portions of the third dielectric layer and the fourth dielectric layer.

11. The method of claim 1, wherein the second dielectric layer includes nitride.

12. The method of claim 1, further comprising:
forming a plurality of first trenches in the plurality of pillars and a plurality of second trenches in the first dielectric layer between the pillars.

13. The method of claim 12, further comprising:
filling the plurality of first trenches and the plurality of second trenches with a conductive material.

14. The method of claim 13, further comprising:
forming a second oxide layer conformal to each of the plurality of first trenches prior to the filling of the first and second trenches with the conductive material.

15. The method of claim 13, wherein the second oxide layer is formed by an oxidation.

* * * * *